(12) United States Patent
Yamazaki

(10) Patent No.: US 9,893,204 B2
(45) Date of Patent: Feb. 13, 2018

(54) SEMICONDUCTOR DEVICE HAVING TRANSISTOR INCLUDING TWO OXIDE SEMICONDUCTOR LAYERS HAVING DIFFERENT LATTICE CONSTANTS

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/359,822

(22) Filed: Nov. 23, 2016

(65) Prior Publication Data

US 2017/0170324 A1 Jun. 15, 2017

Related U.S. Application Data

(63) Continuation of application No. 14/957,709, filed on Dec. 3, 2015, now Pat. No. 9,508,742, which is a (Continued)

(30) Foreign Application Priority Data

Dec. 11, 2009 (JP) ................................. 2009-281949

(51) Int. Cl.
*H01L 29/24* (2006.01)
*H01L 29/786* (2006.01)
(Continued)

(52) U.S. Cl.
CPC ........ *H01L 29/7869* (2013.01); *H01L 23/528* (2013.01); *H01L 27/092* (2013.01);
(Continued)

(58) Field of Classification Search
CPC ..... H01L 27/1225; H01L 29/24; H01L 29/26; H01L 29/78681
See application file for complete search history.

(56) References Cited

U.S. PATENT DOCUMENTS 5,274,601 A 12/1993 Kawahara et al.
5,731,856 A 3/1998 Kim et al.
(Continued)

FOREIGN PATENT DOCUMENTS

CN 001258132 A 6/2000
CN 001848441 A 10/2006
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Stephen W Smoot
(74) *Attorney, Agent, or Firm* — Fish & Richardson P.C.

(57) ABSTRACT

One object is to provide a new semiconductor device whose standby power is sufficiently reduced. The semiconductor device includes a first power supply terminal, a second power supply terminal, a switching transistor using an oxide semiconductor material and an integrated circuit. The first power supply terminal is electrically connected to one of a source terminal and a drain terminal of the switching transistor. The other of the source terminal and the drain terminal of the switching transistor is electrically connected to one terminal of the integrated circuit. The other terminal of the integrated circuit is electrically connected to the second power supply terminal.

17 Claims, 11 Drawing Sheets

Related U.S. Application Data continuation of application No. 14/341,923, filed on Jul. 28, 2014, now Pat. No. 9,209,251, which is a continuation of application No. 14/077,268, filed on Nov. 12, 2013, now Pat. No. 8,901,559, which is a continuation of application No. 12/962,929, filed on Dec. 8, 2010, now Pat. No. 8,809,850.

(51) Int. Cl.
   *H01L 27/12* (2006.01)
   *H01L 27/092* (2006.01)
   *H01L 23/528* (2006.01)
   *H01L 29/26* (2006.01)

(52) U.S. Cl.
   CPC .......... *H01L 27/1225* (2013.01); *H01L 29/24* (2013.01); *H01L 29/26* (2013.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,307,236 B1 | 10/2001 | Matsuzaki et al. |
| 6,348,831 B1 | 2/2002 | Baba |
| 6,351,078 B1 | 2/2002 | Wang et al. |
| 6,353,244 B1 | 3/2002 | Yamazaki et al. |
| 6,500,715 B2 | 12/2002 | Matsuzaki et al. |
| 6,563,174 B2 | 5/2003 | Kawasaki et al. |
| 6,635,934 B2 | 10/2003 | Hidaka |
| 6,727,522 B1 | 4/2004 | Kawasaki et al. |
| 6,878,962 B1 | 4/2005 | Kawasaki et al. |
| 6,911,703 B2 | 6/2005 | Hidaka |
| 6,940,307 B1 | 9/2005 | Liu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,224,224 B2 | 5/2007 | Sera et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,348,227 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,425,740 B2 | 9/2008 | Liu et al. |
| 7,427,791 B2 | 9/2008 | Matsuzaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,521,762 B2 | 4/2009 | Hidaka |
| 7,595,533 B2 | 9/2009 | Sera et al. |
| 7,598,520 B2 | 10/2009 | Hirao et al. |
| 7,620,926 B1 | 11/2009 | Tuan |
| 7,674,650 B2 | 3/2010 | Akimoto et al. |
| 7,732,819 B2 | 6/2010 | Akimoto et al. |
| 7,781,814 B2 | 8/2010 | Matsuzaki et al. |
| 7,791,074 B2 | 9/2010 | Iwasaki |
| 7,808,090 B2 | 10/2010 | Shionoiri |
| 7,847,287 B2 | 12/2010 | Kim et al. |
| 7,855,369 B2 | 12/2010 | Takahashi |
| 7,884,360 B2 | 2/2011 | Takechi et al. |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,993,964 B2 | 8/2011 | Hirao et al. |
| 8,003,981 B2 | 8/2011 | Iwasaki et al. |
| 8,077,491 B2 | 12/2011 | Yamasaki |
| 8,084,331 B2 | 12/2011 | Ofuji et al. |
| 8,154,024 B2 | 4/2012 | Iwasaki |
| 8,158,974 B2 | 4/2012 | Yano et al. |
| 8,158,978 B2 | 4/2012 | Kim et al. |
| 8,202,365 B2 | 6/2012 | Umeda et al. |
| 8,274,077 B2 | 9/2012 | Akimoto et al. |
| 8,304,298 B2 | 11/2012 | Ofuji et al. |
| 8,354,674 B2 | 1/2013 | Kimura |
| 8,410,838 B2 | 4/2013 | Kato et al. |
| 8,420,442 B2 | 4/2013 | Takechi et al. |
| 8,441,099 B2 | 5/2013 | Shionoiri |
| 8,466,463 B2 | 6/2013 | Akimoto et al. |
| 8,513,662 B2 | 8/2013 | Yabuta et al. |
| 8,530,246 B2 | 9/2013 | Ofuji et al. |
| 8,784,700 B2 | 7/2014 | Inoue et al. |
| 8,860,485 B2 | 10/2014 | Kato et al. |
| 9,350,334 B2 | 5/2016 | Kato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0052371 A1 | 3/2003 | Matsuzaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0046209 A1 | 3/2004 | Sera et al. |
| 2004/0127038 A1 | 7/2004 | Carcia et al. |
| 2005/0017302 A1 | 1/2005 | Hoffman |
| 2005/0133917 A1 | 6/2005 | Hoffman et al. |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125098 A1 | 6/2006 | Hoffman et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0226493 A1 | 10/2006 | Chuang et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0075743 A1 | 4/2007 | Oh |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194377 A1 | 8/2007 | Sera et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0213954 A1 | 9/2008 | Yamazaki et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008638 A1 | 1/2009 | Kang et al. |
| 2009/0008639 A1 | 1/2009 | Akimoto et al. |
| 2009/0050941 A1 | 2/2009 | Yamazaki et al. |
| 2009/0068773 A1 | 3/2009 | Lai et al. |
| 2009/0073325 A1 | 3/2009 | Kuwabara et al. |
| 2009/0076322 A1 | 3/2009 | Matsunaga et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179692 A1 | 7/2009 | Hidaka |
| 2009/0278122 A1 | 11/2009 | Hosono et al. |
| 2009/0280600 A1 | 11/2009 | Hosono et al. |
| 2009/0295463 A1 | 12/2009 | Katou |
| 2009/0305461 A1 | 12/2009 | Akimoto et al. |
| 2010/0059744 A1 | 3/2010 | Yin et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0193785 A1 | 8/2010 | Kimura |
| 2011/0012180 A1 | 1/2011 | Matsuzaki et al. |
| 2011/0101333 A1 | 5/2011 | Shionoiri et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0140108 A1* | 6/2011 | Kimura ............... H01L 29/786 257/57 |
| 2011/0175646 A1 | 7/2011 | Takemura et al. |
| 2011/0187410 A1* | 8/2011 | Kato ............... G11C 14/0054 326/46 |
| 2011/0256684 A1 | 10/2011 | Iwasaki et al. |
| 2011/0260157 A1 | 10/2011 | Yano et al. |
| 2012/0012847 A1* | 1/2012 | Koyama ............ G02F 1/13454 257/59 |
| 2012/0168748 A1 | 7/2012 | Yano et al. |
| 2013/0237012 A1 | 9/2013 | Takechi et al. |
| 2014/0001040 A1 | 1/2014 | Inoue et al. |
| 2014/0021980 A1 | 1/2014 | Takemura et al. |
| 2014/0252346 A1 | 9/2014 | Takemura et al. |
| 2014/0339073 A1 | 11/2014 | Inoue et al. |
| 2016/0226471 A1 | 8/2016 | Kato et al. |

FOREIGN PATENT DOCUMENTS

| | | |
|---|---|---|
| CN | 101015051 A | 8/2007 |
| CN | 101558184 A | 10/2009 |
| CN | 102668077 A | 9/2012 |
| CN | 102640279 B | 6/2015 |
| EP | 0951072 A | 10/1999 |
| EP | 1162744 A | 12/2001 |
| EP | 1172858 A | 1/2002 |
| EP | 1351392 A | 10/2003 |
| EP | 1398836 A | 3/2004 |
| EP | 1544907 A | 6/2005 |
| EP | 1737044 A | 12/2006 |
| EP | 1770788 A | 4/2007 |
| EP | 1873786 A | 1/2008 |
| EP | 1995787 A | 11/2008 |
| EP | 1998373 A | 12/2008 |
| EP | 1998374 A | 12/2008 |
| EP | 1998375 A | 12/2008 |
| EP | 2096188 A | 9/2009 |
| EP | 2148418 A | 1/2010 |
| EP | 1803154 B | 8/2010 |
| EP | 2226847 A | 9/2010 |
| EP | 2228819 A | 9/2010 |
| EP | 2339639 A | 6/2011 |
| EP | 2471972 A | 7/2012 |
| EP | 2669402 A | 12/2013 |
| EP | 2887395 A | 6/2015 |
| JP | 60-198861 A | 10/1985 |
| JP | 62-115874 A | 5/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-210976 A | 8/1993 |
| JP | 05-251705 A | 9/1993 |
| JP | 08-186180 A | 7/1996 |
| JP | 08-264794 A | 10/1996 |
| JP | 11-505377 | 5/1999 |
| JP | 11-233789 A | 8/1999 |
| JP | 2000-044236 A | 2/2000 |
| JP | 2000-150900 A | 5/2000 |
| JP | 2000-243851 A | 9/2000 |
| JP | 2000-277534 A | 10/2000 |
| JP | 2001-053599 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-128487 A | 4/2004 |
| JP | 2004-273614 A | 9/2004 |
| JP | 2004-273732 A | 9/2004 |
| JP | 2004-341540 A | 12/2004 |
| JP | 2006-108654 A | 4/2006 |
| JP | 2007-103918 A | 4/2007 |
| JP | 2007-123861 A | 5/2007 |
| JP | 2007-220820 A | 8/2007 |
| JP | 2007-250983 A | 9/2007 |
| JP | 2008-042088 A | 2/2008 |
| JP | 2008-085348 A | 4/2008 |
| JP | 2009-004733 A | 1/2009 |
| JP | 2009-016844 A | 1/2009 |
| JP | 2009-089351 A | 4/2009 |
| JP | 2009-130209 A | 6/2009 |
| JP | 2009-135350 A | 6/2009 |
| JP | 2009-167087 A | 7/2009 |
| JP | 2009-528670 | 8/2009 |
| JP | 2009-212443 A | 9/2009 |
| JP | 2009-246362 A | 10/2009 |
| JP | 2009-276387 A | 11/2009 |
| JP | 2009-277702 A | 11/2009 |
| KR | 2001-0110643 A | 12/2001 |
| TW | 200715477 | 4/2007 |
| TW | 200843317 | 11/2008 |
| TW | 200917419 | 4/2009 |
| WO | WO-2004/114391 | 12/2004 |
| WO | WO-2005/122272 | 12/2005 |
| WO | WO-2006/028195 | 3/2006 |
| WO | WO-2007/029844 | 3/2007 |
| WO | WO-2007/119386 | 10/2007 |
| WO | WO-2007/142167 | 12/2007 |
| WO | WO-2008/117739 | 10/2008 |
| WO | WO-2008/136505 | 11/2008 |
| WO | WO-2008/143304 | 11/2008 |
| WO | WO-2009/034953 | 3/2009 |
| WO | WO-2009/110623 | 9/2009 |
| WO | WO-2009/139482 | 11/2009 |
| WO | WO-2009/139483 | 11/2009 |
| WO | WO-2011/052386 | 5/2011 |
| WO | WO-2011/062075 | 5/2011 |

OTHER PUBLICATIONS

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.
Chern.H et al., "An Analytical Model for the Above-Threshold Characteristics of Polysilicon Thin-Film Transistors", IEEE Tranactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17. 22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Oxygen Vacancies in ZnO", Appl. Phys. Lett. (Applied Physics Letters) , 2005, vol. 87, pp. 122102-1-122102-3.
Janotti.A et al., "Native Point Defects in ZnO", Phys. Rev. B (Physical Review. B), Oct. 4, 2007, vol. 76, No. 16, pp. 165202-1-165202-22.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kamiya.T et al., "Transparent Oxide Semiconductor and Their Device Applications", Optronics, Oct. 1, 2004, vol. 23, No. 10, pp. 128-139.
Kanno.H et al., "White Stacked Electrophosphorecent Organic Light-Emitting Devices Employing Moo3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. b), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Socity), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Porceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Takagi.S, "The Present and Challenges of Transparent Couductive Film", the Journal of the Vacuume Society of Japan (J. Vac. Soc. Jpn.), 2007, vol. 50, No. 2, pp. 105-110.

International Search Report (Application No. PCT/JP2010/071191) dated Jan. 25, 2011.

Written Opinion (Application No. PCT/JP2010/071191) dated Jan. 25, 2011.

Chinese Office Action (Application No. 201080056245.6) dated Feb. 20, 2014.

Choi.D et al., "New Non-Volatile Memory Structures for FPGA Architectures", IEEE Transactions on Very Large Scale Integration (VLSI) Systems , Jul. 1, 2008, vol. 16, No. 7, pp. 874-881, IEEE.

Taiwanese Office Action (Application No. 102143759) dated Sep. 17, 2015.

Korean Office Action (Application No. 2012-7017765) dated Jun. 16, 2016.

Taiwanese Office Action (Application No. 105105298) dated Aug. 22, 2016.

Chinese Office Action (Application No. 201510003952.3) dated Mar. 3, 2017.

Korean Office Action (Application No. 2017-7022155) dated Aug. 21, 2017.

Chinese Office Action (Application No. 201510003952.3) dated Oct. 31, 2017.

\* cited by examiner

SEMICONDUCTOR DEVICE HAVING TRANSISTOR INCLUDING TWO OXIDE SEMICONDUCTOR LAYERS HAVING DIFFERENT LATTICE CONSTANTS

CROSS-REFERENCE TO RELATED APPLICATIONS

This application is a continuation of U.S. application Ser. No. 14/957,709, filed Dec. 3, 2015, now U.S. Pat. No. 9,508,742, which is a continuation of U.S. application Ser. No. 14/341,923, filed Jul. 28, 2014, now U.S. Pat. No. 9,209,251, which is a continuation of U.S. application Ser. No. 14/077,268, filed Nov. 12, 2013, now U.S. Pat. No. 8,901,559, which is a continuation of U.S. application Ser. No. 12/962,929, filed Dec. 8, 2010, now U.S. Pat. No. 8,809,850, which claims the benefit of a foreign priority application filed in Japan as Serial No. 2009-281949 on Dec. 11, 2009, all of which are incorporated by reference.

TECHNICAL FIELD

The technical field of the disclosed invention relates to a semiconductor device using an oxide semiconductor. The semiconductor device in this specification indicates all the devices that operate by utilizing semiconductor characteristics. For example, a semiconductor device widely includes the following elements: a semiconductor element (including a so-called power device) such as a transistor, a diode and a thyristor, an integrated circuit such as an image sensor, a memory and a converter, an integrated circuit including the above elements and a display device and the like typified by a liquid crystal display device.

BACKGROUND ART

A CMOS circuit is a necessary component for a semiconductor integrated circuit because a CMOS circuit has low power consumption and can operate at high speed and can be highly integrated. On the other hand, in recent years, in accordance with miniaturization of a MOS transistor, an increase of power consumption at the time when an increase of power consumption in a non operating state (power consumption in a standby period, hereinafter also referred to as standby power) due to an increase of leakage current (also referred to as off state current, subthreshold current or the like) has been a problem. For example, in a silicon MOS transistor whose channel length is miniaturized to approximately 0.1 µm or less, the value of drain current cannot be made zero when a potential between a gate and a source is set to threshold voltage or less.

To prevent an increase of the standby power due to the leakage current, a technique using a switching transistor has been proposed (for example, see Patent Document 1). The technique disclosed in Patent Document 1 is as follows: a switching transistor having small leakage current compared to a CMOS circuit is provided between a power supply and the CMOS circuit; the switching transistor is turned off when the CMOS circuit is not in operation so that standby power is decreased.

REFERENCE

[Patent Document 1] Japanese Published Patent Application No. H5-210976

DISCLOSURE OF INVENTION

Standby power depends on the leakage current of the switching transistor in the technique disclosed in Patent Document 1. That is, standby power can be sufficiently reduced by sufficiently reducing the leakage current of the switching transistor.

In contrast to this, sufficient current is needed for operating a CMOS circuit to secure appropriate operation of a CMOS circuit. Therefore, in the case where the switching transistor in the technique disclosed in Patent Document 1 is provided, the channel width of the switching transistor needs to be equivalent to or more than that of a transistor included in a CMOS circuit, in order to supply sufficient current to a CMOS circuit and secure operation of a CMOS circuit.

In view of the above problems, a method for suppressing the leakage current of a switching transistor itself by making the channel width of the switching transistor smaller than that of a transistor included in an integrated circuit is not practical.

Thus, it is difficult to make standby power of a CMOS circuit substantially zero in the technique disclosed in Patent Document 1. Thus, there is a problem in that a slight amount of standby power of each circuit included in an integrated circuit accumulates to be a large amount of standby power in an integrated circuit including a group of a number of circuits or the like.

In view of the above problems, one object of the present invention is to provide a new semiconductor device whose standby power is sufficiently reduced.

In the disclosed invention, a semiconductor device (for example, a transistor) is formed using a highly purified oxide semiconductor. The leakage current of the transistor formed using a highly purified oxide semiconductor is extremely small, so that on/off ratio can be sufficiently increased. In other words, the leakage current of the transistor can be kept at extremely low level even when current drive capability of the transistor is sufficiently secured.

The above-described oxide semiconductor is used for the following structure, whereby standby power of a semiconductor device can be sufficiently suppressed.

For example, one embodiment of the disclosed invention is a semiconductor device including a first power supply terminal, a second power supply terminal, a switching transistor including an oxide semiconductor material and an integrated circuit. The first power supply terminal is electrically connected to one of a source terminal and a drain terminal of the switching transistor. The other of the source terminal and the drain terminal of the switching transistor is electrically connected to one terminal of the integrated circuit. The other terminal of the integrated circuit is electrically connected to the second power supply terminal.

In addition, another embodiment of the disclosed invention is a semiconductor device including a first power supply terminal, a second power supply terminal, a switching transistor including an oxide semiconductor material and having a first control terminal and a second control terminal and an integrated circuit. The first power supply terminal is electrically connected to one of a source terminal and a drain terminal of the switching transistor. The other of the source terminal and the drain terminal of the switching transistor is electrically connected to one terminal of the integrated circuit. The other terminal of the integrated circuit is electrically connected to the second power supply terminal.

The switching transistor may include an oxide semiconductor layer including an oxide semiconductor material, a gate electrode for applying an electric field to the oxide semiconductor layer, a gate insulating layer interposed between the oxide semiconductor layer and the gate electrode, and a source electrode and a drain electrode electrically connected to the oxide semiconductor layer. In addition, a gate electrode for controlling the threshold voltage of the switching transistor may also be included in the switching transistor. Here, the gate electrode corresponds to a control terminal, the source electrode corresponds to a source terminal and the drain electrode corresponds to a drain terminal. Note that each electrode does not need to be the same as each terminal unless circuit operation is prevented. For example, some kind of element (such as a wiring, a switching element, a resistor, an inductor, a capacitor, an element having other various functions) is connected between an electrode (for example, a source electrode) and a terminal (for example, a source terminal) in some cases.

Further, the oxide semiconductor material may be an In—Ga—Zn—O-based oxide semiconductor material.

Furthermore, leakage current of the switching transistor can be $1 \times 10^{-13}$ A or less.

Moreover, the integrated circuit can be formed using a semiconductor material other than an oxide semiconductor material. The semiconductor material other than an oxide semiconductor material can be silicon.

The integrated circuit includes a CMOS circuit.

Note that in this specification, the terms "over" and "below" do not necessarily mean "directly on" and "directly under", respectively, in the description of a physical relationship between components. For example, the expression of "a gate electrode over a gate insulating layer" may refer to the case where another component is interposed between the gate insulating layer and the gate electrode. In addition, the terms "above" and "below" are just used for convenience of explanations and they can be interchanged unless otherwise specified.

In this specification, the terms "electrode" and "wiring" does not limit the function of components. For example, an "electrode" can be used as a part of "wiring", and the "wiring" can be used as a part of the "electrode". In addition, the terms "electrode" and "wiring" can also mean a combination of a plurality of "electrodes" and "wirings", for example.

Further, functions of a "source" and a "drain" might be switched when transistors having different polarities are employed or a direction of current flow is changed in circuit operation, for example. Therefore, the terms "source" and "drain" can be switched in this specification.

Note that in this specification, the expression of "electrically connected" includes the case of electrical connection through "an object having any electrical function". Here, there is no particular limitation on "an object having any electrical function" as long as the object enables transmission and reception of an electrical signal between components which the object connects.

For example, in "an object having any electrical function", a switching element such as a transistor, a resistor, an inductor, a capacitor, and other elements having several functions, are included, as well as electrodes and wirings.

In the disclosed invention, a highly purified oxide semiconductor is used for a semiconductor device. "Highly purified" is a concept including at least one of the following: to remove hydrogen in an oxide semiconductor from the oxide semiconductor layer as much as possible; or to supply oxygen, which is in short supply in an oxide semiconductor, into the oxide semiconductor so that defect level in energy gap due to oxygen deficiency in the oxide semiconductor is reduced.

An oxide semiconductor layer is highly purified as described above to be an intrinsic (i-type) oxide semiconductor. An oxide semiconductor is an n-type semiconductor in general, whereby the leakage current of a transistor using an oxide semiconductor is increased. In the disclosed one embodiment of the invention, an oxide semiconductor is highly purified to be an i-type oxide semiconductor or close to an i-type oxide semiconductor in order to reduce leakage current sufficiently.

In addition, at least part of a semiconductor device is formed including the highly purified oxide semiconductor as described above, so that a semiconductor device whose standby power is sufficiently reduced can be realized. It can be said that effect of the suppression of standby power increases as a circuit becomes complicated.

BEST MODE FOR CARRYING OUT THE INVENTION

Figure 1A:
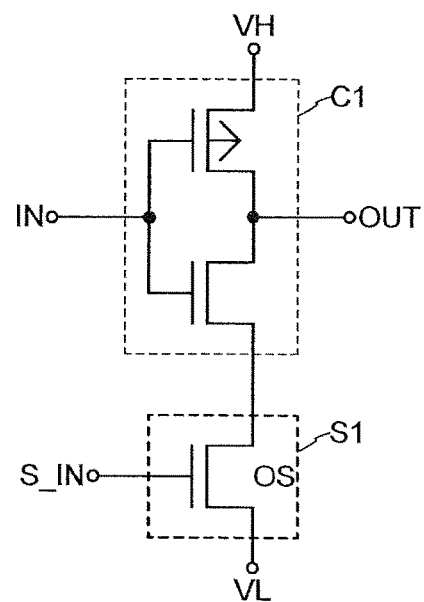
FIGS. 1A and 1B are circuit diagrams relating to an example of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the following embodiments.

Note that for the easy understanding, the position, size, range and the like of each component illustrated in the drawings are not actual ones in some cases. Therefore, the present invention is not limited to the position, size, range and the like disclosed in the drawings.

Note that in this specification, ordinal numbers such as "first", "second", and "third" are used in order to avoid confusion among components, and the terms do not limit the components numerically.

Embodiment 1

In this embodiment, a structure and a manufacturing method of a semiconductor device according to one embodiment of the present invention disclosed will be described with reference to FIGS. 1A and 1B, FIGS. 2A and 2B, FIGS. 3A to 3H, FIGS. 4A to 4G and FIGS. 5A to 5D. Note that in a circuit diagram, "OS" is written beside a transistor in order to indicate that the transistor includes an oxide semiconductor.

<Circuit Configuration and Operation of Semiconductor Device>

Figure 1B:
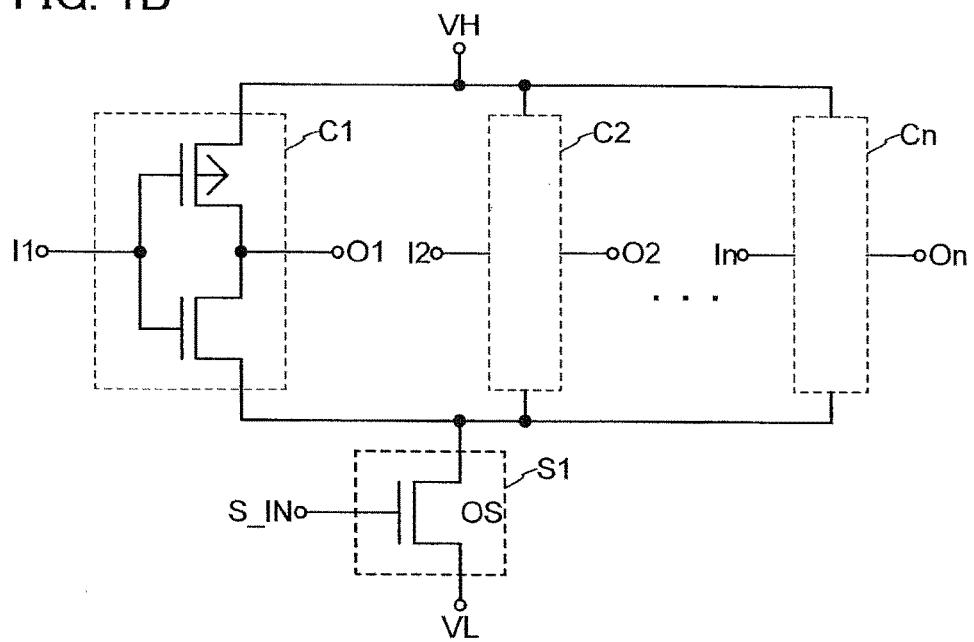

FIGS. 1A and 1B show an example of a circuit configuration of a semiconductor device. FIG. 1A is an example of a semiconductor device using a CMOS inverter circuit which is the simplest CMOS circuit. FIG. 1B is an example of a semiconductor device having a plurality of CMOS inverter circuits.

A semiconductor device shown in FIG. 1A includes a power supply terminal VH, a power supply terminal VL, a switching transistor S1 using an oxide semiconductor material and a CMOS inverter circuit C1. The switching transistor S1 is typically an n-channel transistor using an oxide semiconductor. In addition, a high potential is supplied to the power supply terminal VH and a low potential is supplied to the power supply terminal VL.

Here, the power supply terminal VH is electrically connected to a source terminal of a p-channel transistor in the CMOS inverter circuit C1. A drain terminal of the p-channel transistor in the CMOS inverter circuit C1 and a drain terminal of an n-channel transistor in the CMOS inverter circuit C1 are electrically connected to each other and are connected to an output terminal OUT of the CMOS inverter circuit C1. A source terminal of the n-channel transistor in the CMOS inverter circuit C1 is electrically connected to a drain terminal of the switching transistor S1. A source terminal of the switching transistor S1 is electrically connected to the power supply terminal VL. In addition, a gate terminal of the p-channel transistor in the CMOS inverter circuit C1 and a gate terminal of the n-channel transistor in the CMOS inverter circuit C1 are electrically connected to each other and are connected to an input terminal IN of the CMOS inverter circuit C1.

When the semiconductor device operates, a high potential is input to a control terminal S_IN of the switching transistor S1 and the switching transistor S1 turns on. In this state, when either a high potential or a low potential is input to the input terminal IN, a high potential or a low potential corresponding to the potential is output from the output terminal OUT. For example, when a high potential is input to the input terminal IN, the p-channel transistor in the CMOS inverter circuit C1 turns off and the n-channel transistor in the CMOS inverter circuit C1 turns on, so that the CMOS inverter circuit C1 outputs a low potential corresponding to the potential supplied to the power supply terminal VL. When a low potential is input to the input terminal IN, the p-channel transistor in the CMOS inverter circuit C1 turns on and the n-channel transistor in the CMOS inverter circuit C1 turns off, so that the CMOS inverter circuit C1 outputs a high potential corresponding to the potential supplied to the power supply terminal VH.

When the semiconductor device does not operate, a low potential is input to the control terminal S_IN of the switching transistor S1 and the switching transistor S1 turns off. Current which flows in the CMOS inverter circuit C1 (leakage current) is controlled by the combined resistance of the CMOS inverter circuit C1 and the switching transistor S1, whereby power consumption (power consumption in a standby period, hereinafter also referred to as standby power) can be sufficiently reduced by sufficiently increasing the off state resistance of the switching transistor S1 and sufficiently reducing the leakage current of the switching transistor S1.

A transistor using an oxide semiconductor material has a characteristic of a significantly small off state current. For example, the carrier density of a sufficiently intrinsic oxide semiconductor is less than $1\times10^{12}/cm^3$, preferably less than $1.45\times10^{10}/cm^3$. The off state current of a transistor is $1\times10^{-13}$ A or less for example, in the case where the drain voltage Vd is +1 V or +10 V and the gate voltage Vg is in the range of −5 V to −20 V. Therefore, by forming the switching transistor S1 using an oxide semiconductor, the leakage current of the semiconductor device can be sufficiently reduced. Further, in the case where an oxide semiconductor which is sufficiently intrinsic is used, leakage current at room temperature can be reduced from approximately $1\times10^{-20}$ A (10 zA (zeptoampere)) to $1\times10^{-19}$ A (100 zA). That is, leakage current can even be reduced to substantially zero. The amount of the leakage current does not change even in the case where the channel width of the switching transistor S1 is relatively large. In other words, by a transistor using an oxide semiconductor, sufficient current drive capability can be secured and the leakage current can be reduced by reducing the power consumption of the semiconductor device.

A semiconductor device shown in FIG. 1B corresponds to the semiconductor device shown in FIG. 1A in which the CMOS inverter circuit C1 is replaced with a plurality of CMOS inverter circuits C1 to Cn.

That is, the semiconductor device shown in FIG. 1B includes a power supply terminal VH, a power supply terminal VL, a switching transistor S1 using an oxide semiconductor material and CMOS inverter circuits C1 to Cn (also simply referred to as an integrated circuit). In addition, each of the CMOS inverter circuits includes input terminals I1 to In and output terminals O1 to On. The connection relations of each element are the same as that of FIG. 1A. A difference between FIGS. 1A and 1B is that the plurality of CMOS inverter circuits C1 to Cn is connected to each other in parallel and each of the CMOS inverter circuits is connected to the power supply terminal VH and the switching transistor S1 in FIG. 1B. When a circuit including the plurality of CMOS inverter circuits C1 to Cn connected to each other in parallel is assumed to be one integrated circuit, it can be said that a drain terminal of the switching transistor S1 is electrically connected to one terminal of the integrated circuit and the other terminal of the integrated circuit is electrically connected to the power supply terminal VH.

The operation of the circuits is also the same as that of FIG. 1A. Note that a potential is input to each of the input terminals and a potential corresponding to the input potential is output from each of the output terminals in FIG. 1B, which is different from that of FIG. 1A.

In the above manner, a semiconductor device whose standby power is sufficiently reduced is realized by using an oxide semiconductor, particularly, a highly purified oxide semiconductor for at least as a part of the semiconductor device. In conventional techniques, it is difficult to reduce leakage current to a value which can be considered substantially zero (for example, $1\times10^{-13}$ A or less) while appropriate operation of the semiconductor device is secured. On the other hand, the present invention can realize this. In this regard, the present invention is excellent. Specifically, in a circuit in which a number of circuits is integrated and is complicated, the total amount of standby power is large even if the amount of standby power of each circuit is slight. Therefore, effect of reducing the value of standby power to substantially zero is more noticeable as a circuit is integrated and complicated.

Note that an example of a semiconductor device using a CMOS inverter circuit is described here, but the disclosed invention is not limited thereto. One embodiment of the disclosed invention can be used for any circuit (an integrated circuit) which has a problem with power consumption when a circuit is not in operation.

In addition, although the case where the n-channel switching transistor S1 is used is described above, it is apparent that a p-channel transistor can be used as the switching transistor S1. In this case, it is preferable that the switching transistor S1 be electrically connected to the p-channel transistor in the CMOS inverter circuit, for example.

<Planar Structure and Cross-Sectional Structure of Semiconductor Device>

Figure 2A:
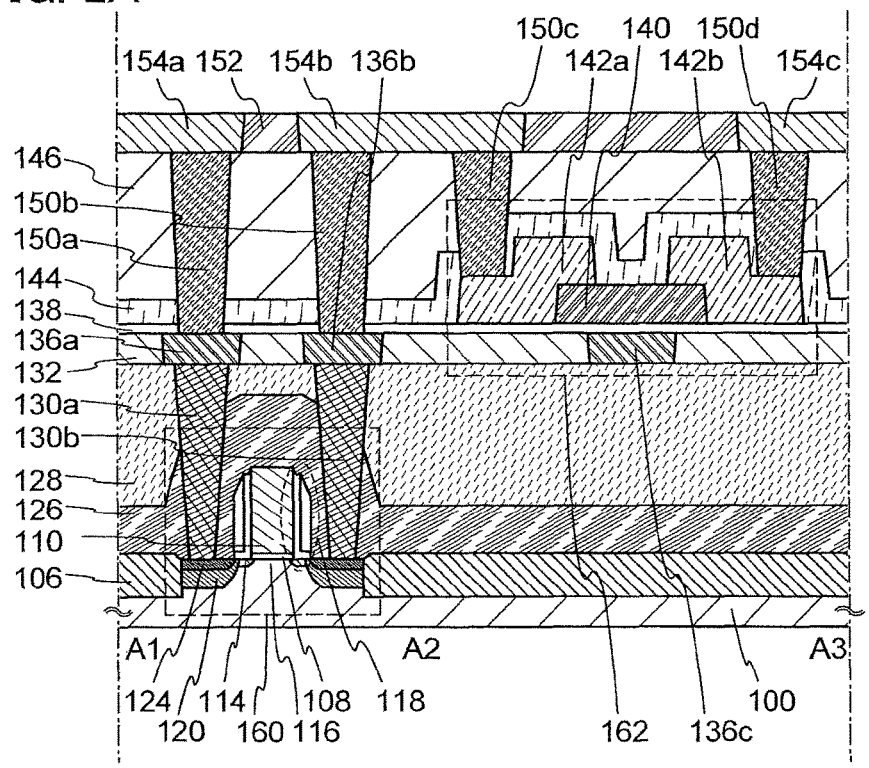
FIG. 2A is a cross-sectional view and FIG. 2B is a plan view each relating to an example of a semiconductor device.
Figure 2B:
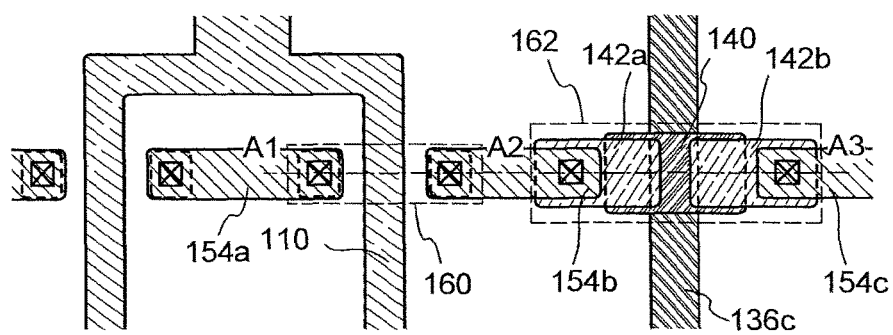

FIGS. 2A and 2B are an example of a structure of the semiconductor device shown in FIG. 1A. FIG. 2A shows a cross section of the semiconductor device and FIG. 2B shows a plan of the semiconductor device. Here, FIG. 2A corresponds to a cross section taken along line A1-A2-A3 in FIG. 2B. The semiconductor device shown in FIGS. 2A and 2B includes a transistor 160 (a transistor included in a CMOS inverter circuit CD using a material other than oxide semiconductor in a lower portion, and a transistor 162 (a transistor functioning as the switching transistor S1) using an oxide semiconductor in an upper portion. Note that the transistors 160 and 162 are both described as n-channel transistors. However, of course, both a p-channel transistor and an n-channel transistor are used in a CMOS inverter circuit. Further, a technical idea of the disclosed invention is to use a transistor using oxide semiconductor as a switching transistor in order to reduce power consumption; thus, a specific structure of the semiconductor device is not limited to the structure described here.

The transistor 160 includes a channel formation region 116 provided in a substrate 100 including a semiconductor material, impurity regions 114 and high-concentration impurity regions 120 (these regions can be collectively referred to simply as impurity regions) provided so as to sandwich the channel formation region 116, a gate insulating layer 108 provided over the channel formation region 116, a gate electrode 110 provided over the gate insulating layer 108 and a source electrode or drain electrode 130a and a source or drain electrode 130b both of which are electrically connected to the impurity regions 114.

Sidewall insulating layers 118 are provided on side surfaces of the gate electrode 110. Moreover, as shown in the plan view, the high-concentration impurity regions 120 are provided in a region of the substrate 100 which does not overlap with the side wall insulating layers 118, and metal compound regions 124 are present over the high-concentration impurity regions 120. An element isolation insulating layer 106 is provided over the substrate 100 so as to surround the transistor 160. An interlayer insulating layer 126 and an interlayer insulating layer 128 are provided so as to cover the transistor 160. The source or drain electrode 130a and the source or drain electrode 130b are electrically connected to the metal compound regions 124 through openings formed in the interlayer insulating layer 126 and the interlayer insulating layer 128. That is, the source or drain electrode 130a and the source or drain electrode 130b are electrically connected to the high-concentration impurity regions 120 and the impurity regions 114 through the metal compound regions 124.

The transistor 162 includes a gate electrode 136c provided over the interlayer insulating layer 128, a gate insulating layer 138 provided over the gate electrode 136c, an oxide semiconductor layer 140 provided over the gate insulating layer 138 and a source or drain electrode 142a and a source or drain electrode 142b both of which are provided over the oxide semiconductor layer 140 and electrically connected to the oxide semiconductor layer 140.

Here, the gate electrode 136c is formed so as to be embedded in an insulating layer 132 provided over the interlayer insulating layer 128. Like the gate electrode 136c, an electrode 136a and an electrode 136b are formed in contact with the source or drain electrode 130a and the source or drain electrode 130b, respectively.

A protective insulating layer 144 is provided over the transistor 162 so as to be in contact with part of the oxide semiconductor layer 140. An interlayer insulating layer 146 is provided over the protective insulating layer 144. Here, the protective insulating layer 144 and the interlayer insulating layer 146 are provided with openings reaching the source or drain electrode 142a and the source or drain electrode 142b. An electrode 150c and an electrode 150d are in contact with the source or drain electrode 142a and the source or drain electrode 142b through the openings. Like the electrode 150c and the electrode 150d, an electrode 150a and an electrode 150b are formed in contact with the electrode 136a and the electrode 136b, respectively, through openings in the gate insulating layer 138, the protective insulating layer 144 and the interlayer insulating layer 146.

Here, the oxide semiconductor layer 140 is preferably a highly purified oxide semiconductor layer by sufficiently removing impurities such as hydrogen or sufficiently supplying oxygen. Specifically, the hydrogen concentration of the oxide semiconductor layer 140 is $5 \times 10^{19}$ atoms/cm$^3$ or less, preferably $5 \times 10^{18}$ atoms/cm$^3$ or less, and more preferably $5 \times 10^{17}$ atoms/cm$^3$ or less. The carrier concentration of the oxide semiconductor layer 140 which is highly purified and the hydrogen concentration of which is sufficiently reduced and defect level in energy gap due to oxygen deficiency is reduced by sufficiently supplying oxygen is as follows: less than $1 \times 10^{12}$/cm$^3$, preferably less than $1 \times 10^{11}$/cm$^3$, more preferably less than $1.45 \times 10^{10}$/cm$^3$. For example, when the drain voltage Vd is +1 V or +10 V and the gate voltage Vg ranges from −20 V to −5 V, the off state current is $1 \times 10^{-13}$ A or less. In addition, the off state resistivity is $1 \times 10^{9}$ Ω·m or more, preferably $1 \times 10^{10}$ Ω·m or more. The transistor 162 with very excellent off current characteristics can be obtained with the use of such an oxide semiconductor that is highly purified to be intrinsic (i-type) or substantially intrinsic (i-type). Note that the hydrogen concentration in the oxide semiconductor layer 140 is measured by secondary ion mass spectrometry (SIMS).

Furthermore, the insulating layer 152 is provided over the interlayer insulating layer 146. The electrode 154a, the electrode 154b and the electrode 154c are provided so as to be embedded in the insulating layer 152. Here, the electrode 154a is in contact with the electrode 150a, the electrode 154b is in contact with the electrodes 150b and 150c and the electrode 154c is in contact with the electrode 150d.

That is, in the semiconductor device shown in FIGS. 2A and 2B, the source or drain electrode 130b of the transistor 160 is electrically connected to the source or drain electrode 142a of the transistor 162 through the electrode 136b, the electrode 150b, the electrode 154b and the electrode 150c.

<Method for Manufacturing Semiconductor Device>

Next, an example of the manufacturing method of the above semiconductor device will be described. First, a method for manufacturing the transistor 160 in the lower portion will be described below with reference to FIGS. 3A to 3H, and then a method for manufacturing the transistor 162 in the upper portion will be described with reference to FIGS. 4A to 4G and FIGS. 5A to 5D.

<Method for Manufacturing Transistor in Lower Portion>

Figure 3A:
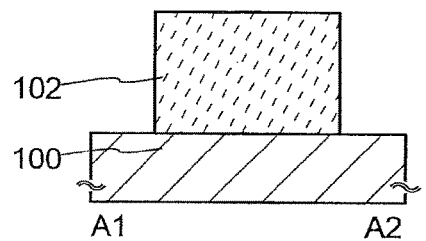
FIGS. 3A to 3H are cross-sectional views relating to manufacturing steps of a semiconductor device.
Figure 3E:
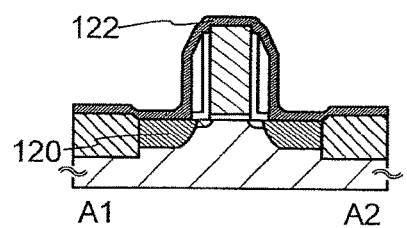

First, the substrate 100 containing a semiconductor material is prepared (see FIG. 3A). As the substrate 100 containing a semiconductor material, a single crystal semiconductor substrate or a polycrystalline semiconductor substrate containing silicon, silicon carbide or the like, a compound semiconductor substrate containing silicon germanium or the like, an SOI substrate or the like can be used. Here, an example in which a single crystal silicon substrate is used as the substrate 100 containing a semiconductor material is described. Note that in general, the term "SOI substrate" means a substrate having a silicon semiconductor layer over an insulating surface. In this specification, the term "SOI substrate" also means a substrate having a semiconductor layer using a material other than silicon over an insulating surface. That is, a semiconductor layer included in the "SOI substrate" is not limited to a silicon semiconductor layer. In addition, the SOI substrate includes a substrate having a semiconductor layer over its insulating substrate such as a glass substrate, with an insulating layer between the semiconductor layer and the insulating substrate.

Over the substrate 100, a protective layer 102 which functions as a mask for forming an element isolation insulating layer is formed (see FIG. 3A). As the protective layer 102, for example, an insulating layer formed using silicon oxide, silicon nitride, silicon oxynitride or the like can be used. Note that an impurity element giving n-type conductivity or an impurity element giving p-type conductivity may be added to the substrate 100 before or after the above step to control the threshold voltage of the transistor. As the impurity giving n-type conductivity, phosphorus, arsenic or the like can be used when the semiconductor is silicon. As the impurity giving p-type conductivity, boron, aluminum, gallium, or the like can be used, for example.

Next, part of the substrate 100 in a region which is not covered with the protective layer 102 (an exposed region) is removed by etching with the use of the protective layer 102 as a mask. Thus, a semiconductor region 104 which is separated is formed (see FIG. 3B). For the etching, dry etching is preferably performed, but wet etching may also be performed. An etching gas and an etchant can be selected as appropriate depending on a material of the object to be etched.

Figure 3B:
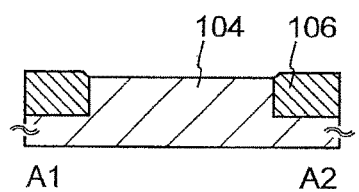
Figure 3F:
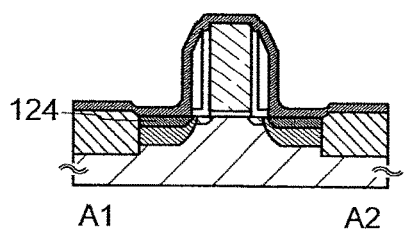

Next, an insulating layer is formed so as to cover the semiconductor region 104 and is selectively removed in a region which overlaps with the semiconductor region 104, whereby the element isolation insulating layer 106 is formed (see FIG. 3B). The insulating layer is formed using silicon oxide, silicon nitride, silicon oxynitride or the like. As a method for removing the insulating layer, there are etching treatment and polishing treatment such as CMP, and any of them can be employed. Note that the protective layer 102 is removed either after the semiconductor region 104 is formed or after the element isolation insulating layer 106 is formed.

Then, an insulating layer is formed over the semiconductor region 104 and a layer containing a conductive material is formed over the insulating layer.

The insulating layer serves as a gate insulating layer later and preferably has a single-layer structure or a stacked-layer structure of a film containing silicon oxide, silicon oxynitride, silicon nitride, hafnium oxide, aluminum oxide, tantalum oxide or the like obtained by using a CVD method, a sputtering method or the like. Alternatively, the above insulating layer may be obtained by oxidizing or nitriding a surface of the semiconductor region 104 by high-density plasma treatment or thermal oxidation treatment. The high-density plasma treatment can be performed using, for example, a mixed gas of a rare gas such as He, Ar, Kr or Xe and oxygen, nitrogen oxide, ammonia, nitrogen or hydrogen. There is no particular limitation on the thickness of the insulating layer, but the thickness can be 1 nm or more and 100 nm or less, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing a conductive material. There is also no particular limitation on a method for forming the layer containing a conductive material, and any of a variety of film formation methods such as an evaporation method, a CVD method, a sputtering method and a spin coating method is applicable. Note that in this embodiment, an example of the case where the layer containing a conductive material is formed using a metal material is described.

Figure 3C:
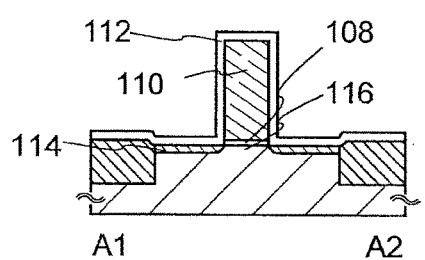

After that, by selectively etching the insulating layer and the layer containing a conductive material, the gate insulating layer 108 and the gate electrode 110 are formed (see FIG. 3C).

Next, an insulating layer 112 which covers the gate electrode 110 is formed (see FIG. 3C). Phosphorus (P), arsenic (As) or the like is then added to the semiconductor region 104, whereby the impurity regions 114 with a shallow junction depth in the substrate 100 are formed (see FIG. 3C). Note that although phosphorus or arsenic is added here so that an n-channel transistor is formed, an impurity element such as boron (B) or aluminum (Al) may be added in the case of forming a p-channel transistor. The channel formation region 116 is formed in the semiconductor region 104 below the gate insulating layer 108 by formation of the impurity regions 114 (see FIG. 3C). Here, the concentration of the added impurity can be set as appropriate; in the case where a semiconductor element is highly miniaturized, the concentration is preferably set to be high. Further, a process in which the insulating layer 112 is formed after formation of the impurity regions 114 may be employed instead of the process employed here in which the impurity regions 114 are formed after formation of the insulating layer 112.

Figure 3G:
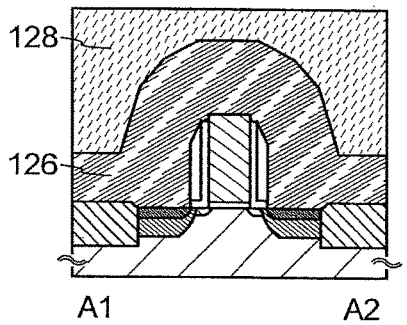
Figure 3D:
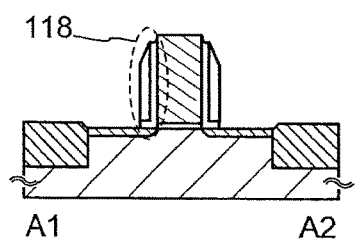

Then, the sidewall insulating layers 118 are formed (see FIG. 3D). An insulating layer is formed so as to cover the insulating layer 112 and then is subjected to highly anisotropic etching treatment, whereby the sidewall insulating layers 118 can be formed in a self-aligned manner. It is preferable that the insulating layer 112 be partly etched at this time so that a top surface of the gate electrode 110 and top surfaces of the impurity regions 114 are exposed.

After that, an insulating layer is formed so as to cover the gate electrode 110, the impurity regions 114, the side wall insulating layers 118 and the like. Phosphorus (P), arsenic (As), or the like is then added to regions where the gate insulating layer is in contact with the impurity regions 114, whereby the high-concentration impurity regions 120 are formed (see FIG. 3E). Next, the above insulating layer is removed and a metal layer 122 is formed so as to cover the gate electrode 110, the sidewall insulating layers 118, the high-concentration impurity regions 120 and the like (see FIG. 3E). Any of a variety of film formation methods such as a vacuum evaporation method, a sputtering method and a spin coating method is applicable to formation of the metal layer 122. It is preferable that the metal layer 122 be formed using a metal material that reacts with a semiconductor material included in the semiconductor region 104 so as to form a metal compound having low resistance. Examples of such a metal material include titanium, tantalum, tungsten, nickel, cobalt and platinum.

Next, heat treatment is performed, whereby the metal layer 122 reacts with the semiconductor material. Consequently, the metal compound regions 124 which are in contact with the high-concentration impurity regions 120 are formed (see FIG. 3F). Note that, in the case of using polycrystalline silicon for the gate electrode 110, a portion of the gate electrode 110 which is in contact with the metal layer 122 also has the metal compound region.

For the heat treatment, irradiation with a flash lamp can be used. Although it is needless to say that another heat treatment method may be used, a method by which heat treatment for an extremely short time can be achieved is preferably used in order to improve the controllability of chemical reaction in formation of the metal compound. Note that the above described metal compound regions are formed through reaction of the metal material with the semiconductor material and have sufficiently high conductivity. By formation of the metal compound regions, electric resistance can be sufficiently reduced and element characteristics can be improved. The metal layer 122 is removed after formation of the metal compound regions 124.

The interlayer insulating layers 126 and 128 are formed so as to cover the components formed in the above steps (see FIG. 3G). The interlayer insulating layers 126 and 128 can be formed using a material containing an inorganic insulating material such as silicon oxide, silicon oxynitride, silicon nitride, hafnium oxide, aluminum oxide or tantalum oxide. Alternatively, an organic insulating material such as polyimide or acrylic can be used. Note that although a two-layer structure has been employed with the interlayer insulating layer 126 and the interlayer insulating layer 128 here, the structure of the interlayer insulating layers is not limited to this. A surface of the interlayer insulating layer 128 is preferably subjected to CMP, etching treatment or the like so as to be flattened after the interlayer insulating layer 128 is formed.

Figure 3H:
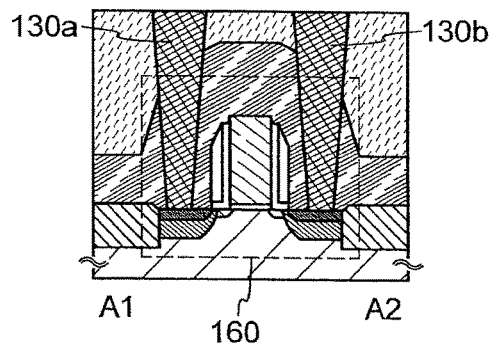

Then, openings reaching the metal compound regions 124 are formed in the interlayer insulating layers, and then the source or drain electrode 130a and the source or drain electrode 130b are formed in the openings (see FIG. 3H). For example, the source or drain electrode 130a and the source or drain electrode 130b can be formed as follows: a conductive layer is formed in a region including the openings by a PVD method, a CVD method or the like; and then, part of the conductive layer is removed by etching treatment, CMP or the like.

Note that in the case of forming the source or drain electrode 130a and the source or drain electrode 130b by removing part of the conductive layer, surfaces thereof are preferably processed to be flat. For example, in the case where a titanium film, a titanium nitride film or the like is formed to have a small thickness in the region including the openings and a tungsten film is then formed so as to fill the openings, CMP which is performed after that can remove an unnecessary portion of the tungsten film, titanium film, titanium nitride film or the like, and improve the flatness of the surfaces. By flattening surfaces including the surfaces of the source or drain electrode 130a and the source or drain electrode 130b as described above, favorable electrodes, wirings, insulating layers, semiconductor layers or the like can be formed in a subsequent step.

Note that although only the source or drain electrode 130a and the source or drain electrode 130b which are in contact with the metal compound regions 124 are described, an electrode which is in contact with the gate electrode 110 and the like can be formed in the same step. There is no particular limitation on a material used for the source or drain electrode 130a and the source or drain electrode 130b and any of a variety of conductive materials can be used. For example, a conductive material such as molybdenum, titanium, chromium, tantalum, tungsten, aluminum, copper, neodymium or scandium can be used.

Through the above process, the transistor 160 including the substrate 100 containing a semiconductor material is formed. Note that electrodes, wirings, insulating layers or the like may be formed as well after the above process is performed. When a multilayer wiring structure in which an interlayer insulating layer and a conductive layer are stacked is employed as a wiring structure, a highly-integrated semiconductor device can be provided.

<Method for Manufacturing Transistor in Upper Portion>

Next, a process through which the transistor 162 is manufactured over the interlayer insulating layer 128 is described with reference to FIGS. 4A to 4G and FIGS. 5A to 5D. Note that the transistor 160 and the like below the transistor 162 are omitted in FIGS. 4A to 4G and FIGS. 5A to 5D, which illustrate a manufacturing process of a variety of electrodes over the interlayer insulating layer 128, the transistor 162 and the like.

Figure 4A:
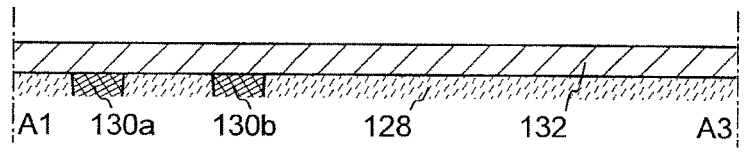
FIGS. 4A to 4G are cross-sectional views relating to manufacturing steps of a semiconductor device.
Figure 4B:
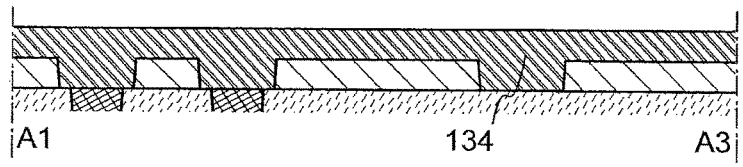

First, the insulating layer 132 is formed over the interlayer insulating layer 128, the source or drain electrode 130a and the source or drain electrode 130b (see FIG. 4A). The insulating layer 132 can be formed by a PVD method, a CVD method or the like. A material containing an inorganic insulating material such as silicon oxide, silicon oxynitride, silicon nitride, hafnium oxide, aluminum oxide or tantalum oxide can be used for the insulating layer 132.

Next, openings reaching the source or drain electrode 130a and the source or drain electrode 130b are formed in the insulating layer 132. At this time, another opening is formed in a region where the gate electrode 136c is to be formed. A conductive layer 134 is formed so as to fill the openings (see FIG. 4B). The above openings can be formed by etching with the use of a mask, for example. The mask can be formed by exposure using a photomask, for example. For the etching, either wet etching or dry etching may be performed but dry etching is preferable in view of the fine patterning. The conductive layer 134 can be formed by a film formation method such as a PVD method or a CVD method. Examples of a material for the conductive layer 134 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 134 can be foil red as follows: a titanium film is formed to have a small thickness by a PVD method in a region including the openings and a titanium nitride film is then formed to have a small thickness by a CVD method; and then, a tungsten film is formed so as to fill the openings. Here, the titanium film formed by a PVD method has a function of reducing an oxide film (e.g., a natural oxide film) formed on a surface over which the titanium film is formed, to decrease the contact resistance with the lower electrodes (here, the source or drain electrode 130a, the source or drain electrode 130b or the like). In addition, the subsequently formed titanium nitride film has a barrier property such that diffusion of a conductive material is prevented. Further, after a barrier film is formed using titanium, titanium nitride or the like, a copper film may be formed by a plating method.

Figure 4C:
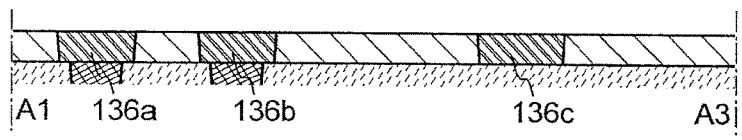

After the conductive layer 134 is formed, part of the conductive layer 134 is removed by etching treatment, CMP or the like so that the insulating layer 132 is exposed and the electrodes 136a, 136b and the gate electrode 136c are formed (see FIG. 4C). Note that when the electrodes 136a, 136b and the gate electrode 136c are formed by removing part of the above conductive layer 134, processing is preferably performed so that flattened surfaces are obtained. By flattening surfaces of the insulating layer 132, the electrodes 136a, 136b and the gate electrode 136c, favorable electrodes, wirings, insulating layers, semiconductor layers and the like can be formed in a subsequent step.

Figure 4D:
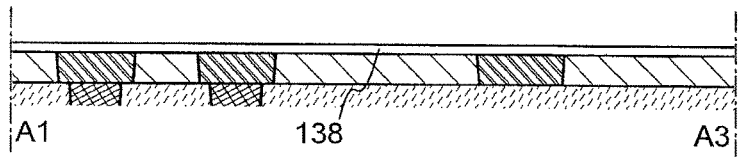

After that, the gate insulating layer 138 is formed so as to cover the insulating layer 132, the electrodes 136a, 136b and the gate electrode 136c (see FIG. 4D). The gate insulating layer 138 can be formed by a sputtering method, a CVD method or the like. The gate insulating layer 138 preferably contains silicon oxide, silicon nitride, silicon oxynitride, aluminum oxide, hafnium oxide, tantalum oxide or the like. Note that the gate insulating layer 138 may have a single-layer structure or a stacked-layer structure. There is no particular limitation on the thickness of the gate insulating layer 138, but the thickness can be 10 nm or more and 500 nm or less, for example. When a stacked-layer structure is employed, the gate insulating layer 138 is preferably formed by stacking a first gate insulating layer with a thickness 50 nm or more and 200 nm or less and a second gate insulating layer with a thickness 5 nm or more and 300 nm or less over the first gate insulating layer.

Note that an oxide semiconductor which is made to be an intrinsic oxide semiconductor or a substantially intrinsic oxide semiconductor by removing an impurity (an oxide semiconductor which is highly purified) is extremely sensitive to an interface energy levels or to the electric charges trapping at the interface; therefore, when such an oxide semiconductor is used for an oxide semiconductor layer, an interface between the oxide semiconductor layer and a gate insulating layer is important. Therefore, the gate insulating layer 138 which is to be in contact with the highly purified oxide semiconductor layer needs to be of high quality.

For example, a high-density plasma CVD method using microwave (2.45 GHz) is favorable because a dense and high-quality gate insulating layer 138 having high withstand voltage can be formed thereby. In this manner, the interface state can be reduced and interface characteristics can be favorable when the highly purified oxide semiconductor layer and the high quality gate insulating layer are in contact with each other.

Needless to say, even when such a highly purified oxide semiconductor layer is used, another method such as a sputtering method or a plasma CVD method can be employed as long as an insulating layer having good quality can be formed as the gate insulating layer. Alternatively, an insulating layer whose film quality and interface characteristics with an oxide semiconductor layer are modified by heat treatment after being formed may be applied. In any case, the gate insulating layer 138 which is of good quality and which is capable of reducing interface state with the oxide semiconductor layer may be formed.

Figure 4E:
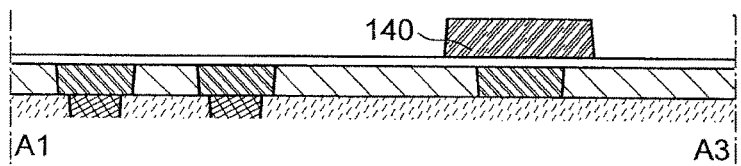

Next, an oxide semiconductor layer is formed over the gate insulating layer 138 and processed by a method such as etching using a mask so that the oxide semiconductor layer 140 having an island-shape is formed (see FIG. 4E).

The oxide semiconductor layer is preferably formed using a sputtering method. For the formation of the oxide semiconductor layer, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer or a Sn—Al—Zn—O-based oxide semiconductor layer which are three-component metal oxide; an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer or an In—Mg—O-based oxide semiconductor layer which are two-component metal oxide; or an In—O-based oxide semiconductor layer, a Sn—O-based oxide semiconductor layer or a Zn—O-based oxide semiconductor layer which are single-component metal oxide can be used. Note that silicon may be added to a metal oxide. For example, the oxide semiconductor layer may be formed using a target containing $SiO_2$ at 2 wt % or more and 10 wt % or less.

Among them, when an In—Ga—Zn—O-based metal oxide is used, a semiconductor device having sufficiently high resistance and sufficiently reduced off state current when there is no electric field, or a semiconductor device having high field effect mobility can be formed. Therefore, an In—Ga—Zn—O-based metal oxide is preferable for a semiconductor material used for a semiconductor device.

As a typical example of the In—Ga—Zn—O-based metal oxide semiconductor, one represented by $InGaO_3(ZnO)_m$ (m>0) is given. In addition, one represented by $InMO_3(ZnO)_m$ (m>0) is given using M instead of Ga. Here, M denotes one or more of metal elements selected from gallium (Ga), aluminum (Al), iron (Fe), nickel (Ni), manganese (Mn), cobalt (Co) and the like. For example, M can be Ga, Ga and Al, Ga and Fe, Ga and Ni, Ga and Mn, Ga and Co or the like. Note that the above described composition is derived from a crystal structure and is just an example.

In this embodiment, the oxide semiconductor layer is formed by a sputtering method using a target for forming an In—Ga—Zn—O-based oxide semiconductor.

For the film formation of the oxide semiconductor layer, a substrate is set in a chamber at reduced pressure and the substrate temperature is preferably set 100° C. or higher and 600° C. or lower, more preferably 200° C. or higher and 400° C. or lower. Here, forming the oxide semiconductor layer while heating the substrate reduces the concentration of impurities contained in the oxide semiconductor layer and reduces damage to the oxide semiconductor layer due to sputtering.

Then, moisture remaining in the treatment chamber is removed at the same time as the introduction of a sputtering gas from which hydrogen, water and the like are removed into the treatment chamber where a metal oxide is used as a target, thereby forming an oxide semiconductor layer. An atmosphere for film formation of the oxide semiconductor layer is preferably a rare gas (typically argon) atmosphere, an oxygen atmosphere or a mixed atmosphere of a rare gas (typically argon) and oxygen. Specifically, a high-purity gas atmosphere is preferable in which the concentration of impurities such as hydrogen, water, hydroxyl and hydride is reduced to a concentration of approximately several parts per million (preferably several parts per billion).

Here, in order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water (H₂O) (and also preferably a compound containing a carbon atom) or the like is removed from a deposition chamber which is evacuated with the cryopump, so that the concentration of impurities contained in the oxide semiconductor layer formed in the deposition chamber can be reduced.

The oxide semiconductor layer is formed to have a thickness of 2 nm or more and 200 nm or less, preferably 5 nm or more and 30 nm or less. Note that an appropriate thickness depends on an applied oxide semiconductor material, and the thickness of the oxide semiconductor layer may be set as appropriate depending on the material.

Further, when a pulse direct current (DC) power supply is used for forming the oxide semiconductor layer, powder substances (also referred to as particles or dust) generated in film formation can be reduced and the film thickness can be uniform.

The oxide semiconductor layer can be formed using a sputtering method under the following conditions, for example: the distance between the substrate and the target is 170 mm; the pressure is 0.4 Pa; the direct current (DC) power supply is 0.5 kW; and the atmosphere is oxygen (the flow rate ratio of oxygen is 100%).

Note that before the oxide semiconductor layer is formed by a sputtering method, dust attached to a surface of the gate insulating layer 138 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere or the like may be used instead of the argon atmosphere.

For the etching of the oxide semiconductor layer, either dry etching or wet etching may be used. Needless to say, a combination of dry etching and wet etching may be employed. The etching conditions (an etching gas, etching solution, etching time, temperature or the like) may be set as appropriate, depending on the material so that the oxide semiconductor layer can be etched into a desired shape.

Examples of the etching gas for dry etching are a gas containing chlorine (a chlorine-based gas such as chlorine ($Cl_2$), boron trichloride ($BCl_3$), silicon tetrachloride ($SiCl_4$) or carbon tetrachloride ($CCl_4$)) and the like. Alternatively, a gas containing fluorine (a fluorine-based gas such as carbon tetrafluoride ($CF_4$), sulfur hexafluoride ($SF_6$), nitrogen trifluoride ($NF_3$) or trifluoromethane ($CHF_3$)); hydrogen bromide (HBr); oxygen ($O_2$); any of these gases to which a rare gas such as helium (He) or argon (Ar) is added; or the like may be used.

As a dry etching method, a parallel plate reactive ion etching (RIE) method or an inductively coupled plasma (ICP) etching method can be used. In order to etch the layer into a desired shape, the etching conditions (the amount of electric power applied to a coil-shaped electrode, the amount of electric power applied to an electrode on a substrate side, the temperature of the electrode on the substrate side or the like) are set as appropriate.

As an etchant used for wet etching, a mixed solution of phosphoric acid, acetic acid and nitric acid or the like can be used. An etchant such as ITO07N (produced by KANTO CHEMICAL CO., INC.) may also be used.

Next, the oxide semiconductor layer is preferably subjected to first heat treatment. By this first heat treatment, the oxide semiconductor layer can be dehydrated or dehydrogenated. The first heat treatment is performed at a temperature 300° C. or higher and 750° C. or lower, preferably 400° C. or higher and 700° C. or lower. For example, the substrate is introduced into an electric furnace using a resistance heating element or the like and the oxide semiconductor layer 140 is subjected to heat treatment in a nitrogen atmosphere at a temperature of 450° C. for an hour. During this time, the oxide semiconductor layer 140 is prevented from being exposed to the air so that entry of hydrogen (including water and the like) is prevented.

Note that a heat treatment apparatus is not limited to an electrical furnace, and may include a device for heating an object to be processed by heat conduction or heat radiation given by a medium such as a heated gas or the like. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA treatment may be performed as follows. The substrate is placed in an inert gas which has been heated to a high temperature of 650° C. to 700° C., heated for several minutes, and taken out from the inert gas. GRTA treatment enables high-temperature heat treatment for a short time. Moreover, in the case where a substrate having low heat resistance such as a glass substrate or the like is used, such heat treatment is applicable even when a temperature exceeds the strain point of the substrate because it takes only short time.

Note that the first heat treatment is preferably performed in an atmosphere which contains nitrogen or a rare gas (such as helium, neon or argon) as its main component and does not contain water, hydrogen or the like. For example, the purity of nitrogen or a rare gas (such as helium, neon or argon) introduced into the heat treatment apparatus is 6N (99.9999%) or more, preferably 7N (99.99999%) or more (that is, the concentration of impurities is 1 ppm or less, preferably 0.1 ppm or less).

In some cases, the oxide semiconductor layer might be crystallized to be an oxide semiconductor layer including a crystal depending on the condition of the first heat treatment or the material of the oxide semiconductor layer. Further, depending on the condition of the first heat treatment or the material of the oxide semiconductor layer, the oxide semiconductor layer may become an amorphous oxide semiconductor layer containing no crystalline component.

In addition, electric characteristics of the oxide semiconductor layer can be changed by providing a crystal layer over the amorphous surface. For example, the electric characteristics of the oxide semiconductor layer can be changed by forming a crystal layer in which a crystal grain having electrical anisotropy is aligned. Such a crystal layer may be referred to as a plate-like crystal according to its shape.

The first heat treatment performed on the oxide semiconductor layer 140 can be performed on the oxide semiconductor layer which has not yet been processed into the island-shaped oxide semiconductor layer 140. In that case, after the first heat treatment, the substrate is taken out of the heating apparatus and a photolithography step is performed.

Note that the first heat treatment can dehydrogenate (dehydrate) the oxide semiconductor layer 140 and thus can be called dehydrogenation treatment (dehydration treatment). It is possible to perform such treatment at any timing, for example, after the oxide semiconductor layer is formed, after the source electrode or the drain electrode is stacked over the oxide semiconductor layer 140 or after a protective insulating layer is formed over the source and drain electrodes. Such treatment may be performed more than once.

In addition, in the case where an oxide semiconductor layer in which hydrogen is sufficiently reduced can be obtained by controlling a film formation atmosphere or the like, the first heat treatment can be omitted.

Figure 4F:
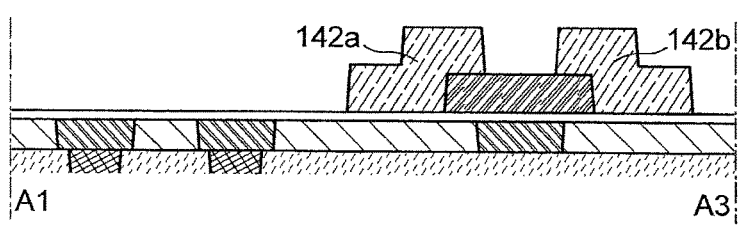

Next, the source or drain electrode 142a and the source or drain electrode 142b are formed in contact with the oxide semiconductor layer 140 (see FIG. 4F). The source or drain electrode 142a and the source or drain electrode 142b can be formed in such a manner that a conductive layer is for iced so as to cover the oxide semiconductor layer 140 and then selectively etched. Note that in some cases, the oxide semiconductor layer 140 is partly etched in this step and thus has a groove portion (a recessed portion) depending on the materials and the etching conditions.

The conductive layer can be formed by a PVD method such as a sputtering method, a CVD method such as a plasma CVD method. As a material of the conductive layer, an element selected from aluminum, chromium, copper, tantalum, titanium, molybdenum and tungsten, an alloy containing any of the above elements as its component or the like can be used. Further, a material containing one or more elements selected from manganese, magnesium, zirconium, beryllium and thorium as a component may be used. A material in which aluminum and one or more elements selected from titanium, tantalum, tungsten, molybdenum, chromium, neodymium and scandium are combined is also applicable to the material of the conductive layer. The conductive layer may have either a single-layer structure or a stacked-layer structure of two or more layers. For example, a single-layer structure of an aluminum film containing silicon, a two-layer structure of an aluminum film and a titanium film stacked thereover, a three-layer structure in which a titanium film, an aluminum film and a titanium film are stacked in this order and the like can be given.

Alternatively, the conductive layer may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO) or any of these metal oxide materials in which silicon or silicon oxide is contained can be used.

The channel length (L) of the transistor is determined by a distance between a lower edge portion of the source or drain electrode 142a and a lower edge portion of the source or drain electrode 142b. In the case where exposure in which the channel length (L) is less than 25 nm, exposure to make a mask for etching may be performed in the extreme ultraviolet range of several nanometers to several tens of nanometers which is extremely short wavelength. In the exposure using extreme ultraviolet light, the resolution is high and the focus depth is large. Therefore, the channel length (L) of the transistor to be formed can be 10 nm or more and 1000 nm or less, whereby operation speed of a circuit can be increased and power consumption can be reduced.

Note that plasma treatment using a gas such as $N_2O$, $N_2$ or Ar is preferably performed after the above step. By this plasma treatment, water and the like attached to a surface of the oxide semiconductor layer which is exposed is removed. Alternatively, plasma treatment may be performed using a gas containing oxygen such as a mixed gas of oxygen and argon. In this manner, the oxide semiconductor layer is supplied with oxygen and defect level in energy gap due to oxygen deficiency can be reduced.

Figure 4G:
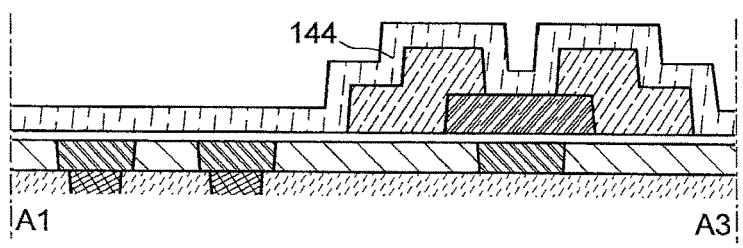

After that, the protective insulating layer 144 which is in contact with part of the oxide semiconductor layer 140 is formed without exposure to the air (see FIG. 4G).

The protective insulating layer 144 can be formed by appropriately employing a method such as a sputtering method, by which an impurity such as hydrogen or water is prevented from entering the protective insulating layer 144. The protective insulating layer 144 is formed to have a thickness 1 nm or more. As a material which can be used for the protective insulating layer 144, there are silicon oxide, silicon nitride, silicon oxynitride and the like. The protective insulating layer 144 may have a single-layer structure or a stacked-layer structure. The substrate temperature for formation of the protective insulating layer 144 is preferably room temperature or higher and 300° C. or lower, preferably a rare gas (typically argon) atmosphere, an oxygen atmosphere or a mixed atmosphere of a rare gas (typically argon) and oxygen.

When hydrogen is contained in the protective insulating layer 144, entry of the hydrogen to the oxide semiconductor layer 140, extraction of oxygen in the oxide semiconductor layer 140 by the hydrogen or the like is caused, and the resistance of the backchannel side of the oxide semiconductor layer 140 is made low, which may form a parasitic channel. Therefore, it is preferable that a formation method in which hydrogen is not used be employed so that the protective insulating layer 144 contains hydrogen as less as possible.

For example, in the case where the protective layer 144 is formed by a sputtering method, as a sputtering gas, a high-purity gas from which a concentration of an impurity such as hydrogen, water, hydroxyl or hydride is reduced to approximately several parts per million (preferably several parts per billion) is used. In addition, moisture remaining in a treatment chamber is preferably removed.

In this embodiment, as a protective insulating layer 144, an insulating layer containing silicon oxide is formed by a sputtering method.

Next, second heat treatment (preferably at a temperature 200° C. or higher and 400° C. or lower, for example, 250° C. or higher and 350° C. or lower) in an inert gas atmosphere or an oxygen atmosphere is preferably performed. For example, the second heat treatment is performed in a nitrogen atmosphere at 250° C. for an hour. The second heat treatment can reduce variation in the electric characteristics of the transistor. Further, by the second heat treatment, oxygen is supplied from an insulating layer containing oxygen to the oxide semiconductor layer and defect level in energy gap due to oxygen deficiency can be reduced. Note that an atmosphere of the second heat treatment is not limited to the above described atmosphere and may be an air atmosphere or the like. In this case, hydrogen, water and the like may be preferably removed from the atmosphere so that hydrogen is not included in the oxide semiconductor layer. Furthermore, the second heat treatment is not an absolutely necessary step, whereby the second heat treatment can be omitted.

Figure 5A:
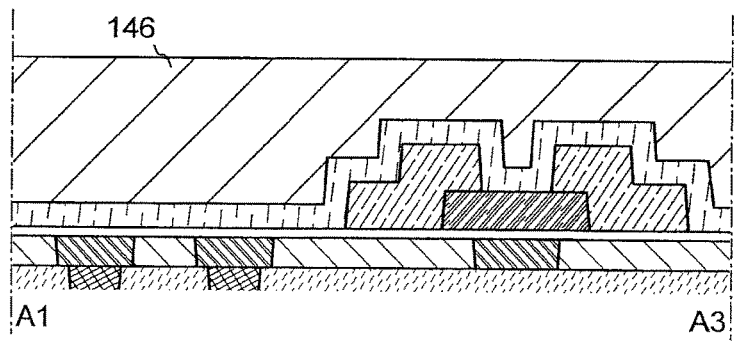
FIGS. 5A to 5D are cross-sectional views relating to manufacturing steps of a semiconductor device.

Then, the interlayer insulating layer 146 is formed over the protective insulating layer 144 (see FIG. 5A). The interlayer insulating layer 146 can be fainted by a PVD method, a CVD method or the like. A material containing an inorganic insulating material such as silicon oxide, silicon oxynitride, silicon nitride, hafnium oxide, aluminum oxide or tantalum oxide can be used for the interlayer insulating layer 146. Further, a surface of the interlayer insulating layer 146 is preferably subjected to CMP, etching or the like so as to be flattened after the interlayer insulating layer 146 is formed.

Figure 5B:
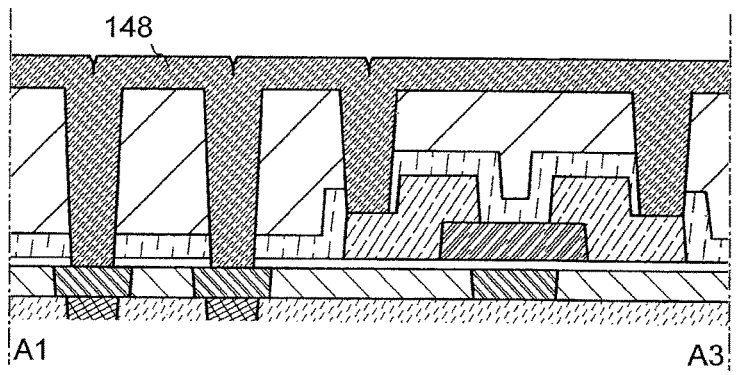

Next, openings reaching the electrodes 136a and 136b, the source or drain electrode 142a and the source or drain electrode 142b are formed in the interlayer insulating layer 146, the protective insulating layer 144, and the gate insulating layer 138; then, a conductive layer 148 is formed so as to fill the openings (see FIG. 5B). The above openings can be formed by etching with the use of a mask, for example. The mask can be formed by exposure using a photomask, for example. For the etching, either wet etching or dry etching may be performed but dry etching is preferable in view of the fine patterning. Materials used for the conductive layer 148, a method for forming the conductive layer 148 and the like is the same as that of the conductive layer 134, so that description about the conductive layer 134 can be referred to for the details.

Figure 5C:
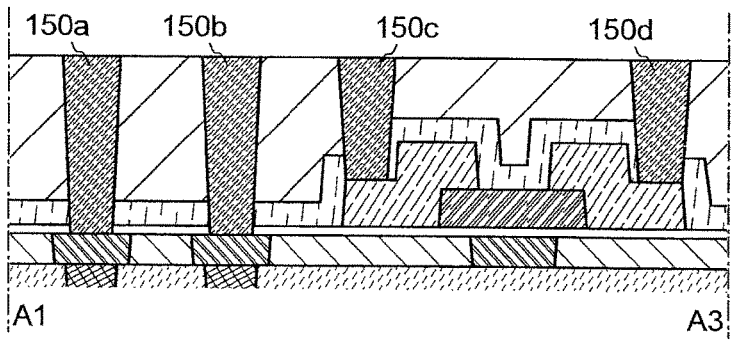
Figure 5D:
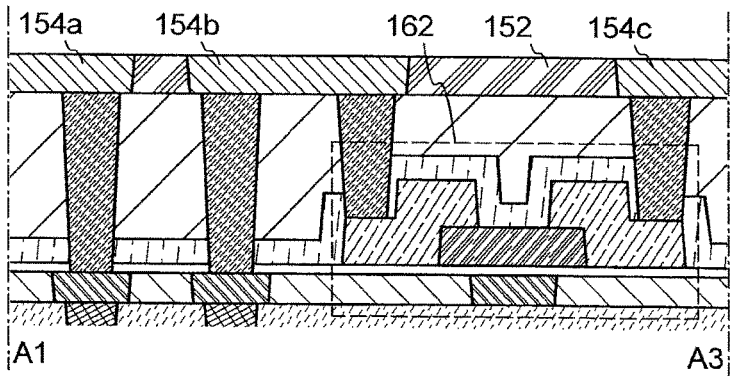

After the conductive layer 148 is formed, part of the conductive layer 148 is removed by etching, CMP or the like so that the interlayer insulating layer 146 is exposed and the electrodes 150a, 150b, 150c and 150d are formed (see FIG. 5C). Note that when the electrodes 150a, 150b, 150c and 150d are formed by removing part of the above conductive layer 148, processing is preferably performed to obtain flattened surfaces. By flattening surfaces of the interlayer insulating layer 146 and the electrodes 150a, 150b, 150c and 150d, favorable electrodes, wirings, insulating layers, semiconductor layers, and the like can be formed in a subsequent step.

After that, the insulating layer 152 is formed. In the insulating layer 152, openings reaching the electrodes 150a, 150b, 150c and 150d are formed. Then, a conductive layer is formed so as to be embedded in the openings. After that, part of the conductive layer is removed by etching, CMP or the like so that the insulating layer 152 is exposed and the electrodes 154a, 154b and 154c are formed (see FIG. 5D). This step is similar to that of the electrode 136a, the electrode 150a and the like; therefore, detailed description is omitted here.

When the transistor 162 is manufactured in the above-described manner, the hydrogen concentration of the oxide semiconductor layer 140 is $5\times10^{19}$ atoms/cm$^3$ or less, preferably $5\times10^{18}$ atoms/cm$^3$ or less, more preferably $5\times10^{17}$ atoms/cm$^3$ or less. The off state current of the transistor 162 is $1\times10^{-13}$ A or less and the off resistivity is $1\times10^{9}$ Ω·m or more (alternatively, $1\times10^{10}$ Ω·m or more). Thus, the transistor 162 having excellent characteristics can be obtained by employing the highly purified oxide semiconductor layer in which the hydrogen concentration is sufficiently reduced and defect level in energy gap due to oxygen deficiency are reduced.

Note that in this embodiment, a semiconductor device related to a stacked-layer structure of a transistor using a material other than an oxide semiconductor and a transistor using an oxide semiconductor; however, a structure which can be used in the disclosed invention is not limited to the stacked-layer structure. A single-layer structure, a stacked-layer structure of two or more layers may be used. For example, since the field effect mobility of an oxide semiconductor is relatively high, a semiconductor device can have a single-layer structure or a stacked-layer structure using only an oxide semiconductor as a semiconductor material. In particular, in the case where an oxide semiconductor having a crystal structure is used, field effect mobility μ can be μ>100 cm$^2$/V·s and a semiconductor device using only an oxide semiconductor can be realized. Further, in this case, a semiconductor device can be formed using a substrate such as a glass substrate or the like.

Furthermore, an arrangement and a connection relation of an electrode (a wiring), an insulating layer, a semiconductor layer and the like, various parameters such as a width of a wiring, a channel width, a channel length and the other conditions can be changed as appropriate in accordance with a function required for a semiconductor integrated circuit. For example, a structure of an electrode, a wiring and the like of a semiconductor device having a single-layer structure is greatly different from that of a semiconductor device having a stacked-layer structure.

The structures, methods and the like described in this embodiment can be combined as appropriate with any of the structures, methods and the like described in the other embodiments.

Embodiment 2

In this embodiment, a semiconductor device having a different configuration from that of the semiconductor device shown in the above embodiment is described with reference to FIGS. 6A and 6B and FIG. 7.

<Circuit Configuration and Operation of Semiconductor Device>

Figure 6A:
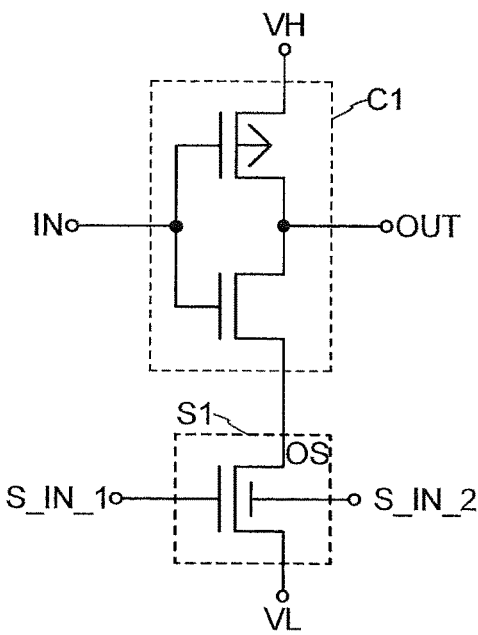
FIGS. 6A and 6B are circuit diagrams relating to an example of a semiconductor device.
Figure 6B:
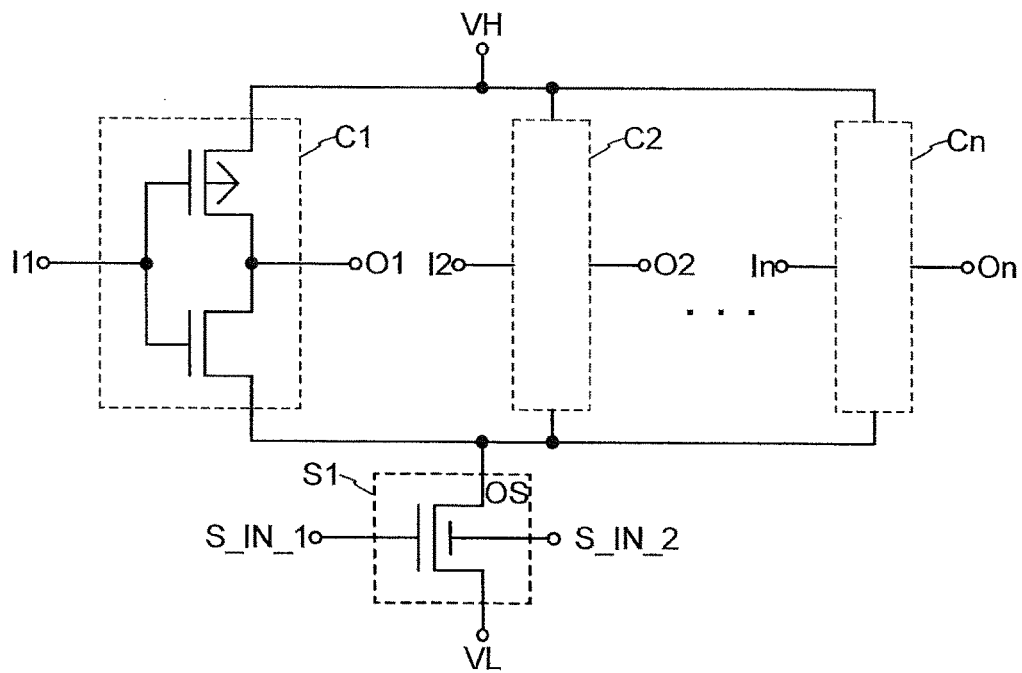

FIGS. 6A and 6B show an example of a circuit configuration of a semiconductor device according to this embodiment. FIG. 6A is an example of a semiconductor device using a CMOS inverter circuit which is the simplest CMOS circuit. FIG. 6B is an example of a semiconductor device having a plurality of CMOS inverter circuits.

A difference between the semiconductor devices shown in FIGS. 6A and 6B and the semiconductor devices shown in FIGS. 1A and 1B is whether the switching transistor S1 using an oxide semiconductor has a back gate or not. In the semiconductor device shown in FIGS. 6A and 6B, the switching transistor S1 has a back gate, so that the threshold voltage of the switching transistor S1 can be controlled by controlling a potential of the back gate. Consequently, an off state leakage current can be easily reduced to the value which can be considered substantially zero.

In this embodiment, since the switching transistor S1 has the back gate as described above, there are two control terminals: control terminal S_IN_1 and control terminal S_IN_2. Similar to the foregoing embodiment, a high potential or a low potential is input to the control terminal S_IN_1, whereby the switching transistor S1 is switched on and off. The value of a potential input to the control terminal S_IN_2 is not particularly limited as long as it is a potential to make a threshold voltage of the switching transistor S1 be a desired value. A constant potential or a fluctuating potential may be input to the control terminal S_IN_2. In addition, a potential like a ground potential may be employed.

The other configuration, operation and the like are the same as those in the foregoing embodiment; thus, a description thereof is omitted.

<Planar Structure and Cross-Sectional Structure of Semiconductor Device>

Figure 7:
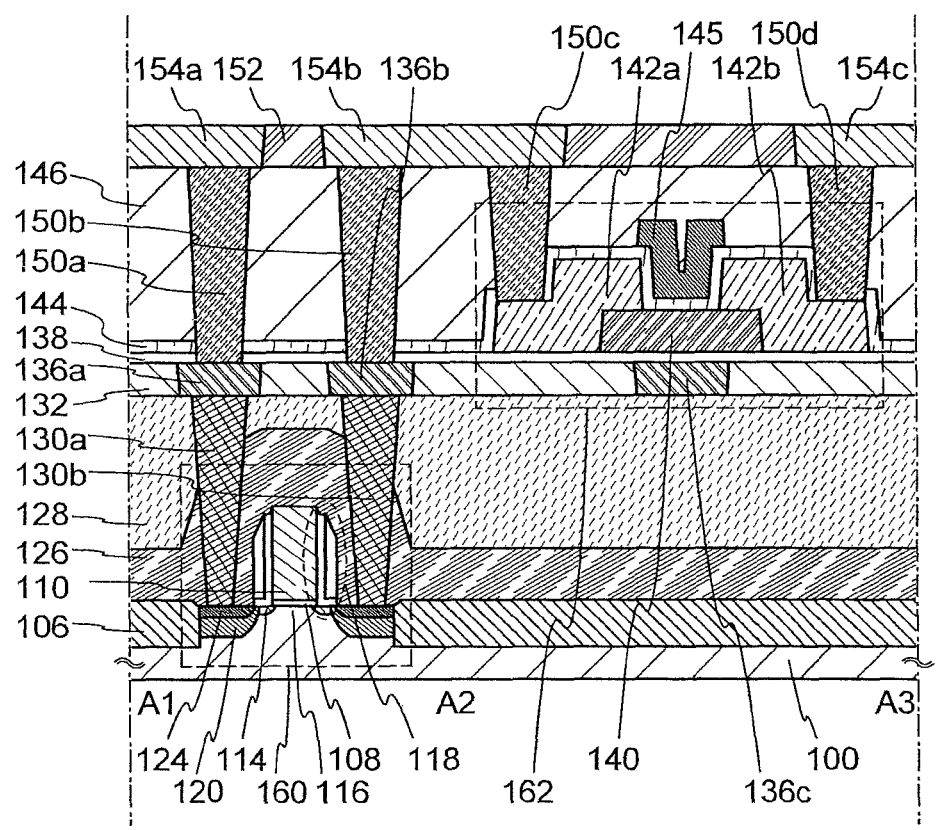
FIG. 7 is a cross-sectional view relating to an example of a semiconductor device.

FIG. 7 is an example of a structure (a cross-section) of the semiconductor device shown in FIG. 6A. The semiconductor device shown in FIG. 7 includes a transistor 160 using a material other than oxide semiconductor in a lower portion (a transistor included in a CMOS inverter circuit C1), and a transistor 162 using an oxide semiconductor in an upper portion (a transistor functioning as the switching transistor S1). At this point, the semiconductor device shown in FIG. 7 is in common with the semiconductor device shown in FIG. 2A. A difference between the semiconductor device shown in FIG. 2A and the semiconductor device shown in FIG. 7 is whether a gate electrode 145 is provided or not in addition to the gate electrode 136c.

The details of each component are the same as those of the semiconductor device shown in the foregoing embodiment. The gate electrode 145 provided in the region over the protective insulating layer 144 which overlaps with the oxide semiconductor layer 140 has a function of generating an electric field which controls the threshold voltage of the transistor 162. Thus, the off state leakage current of the transistor 162 be easily suppressed to the value which can be considered substantially zero. Note that a structure in which the transistor 162 is switched on and off by the gate electrode 136c and the threshold voltage is controlled by the gate electrode 145 is employed; however, the roles of the gate electrode 136c and the gate electrode 145 can be interchanged. In addition, the protective insulating layer 144 also has a function of a gate insulating layer.

The structures, methods and the like shown in this embodiment can be combined as appropriate with any of the structures, methods and the like shown in the other embodiments.

Embodiment 3

In this embodiment, an integrated semiconductor device which is another embodiment of the disclosed invention is described with reference to FIG. 8.

Figure 8:
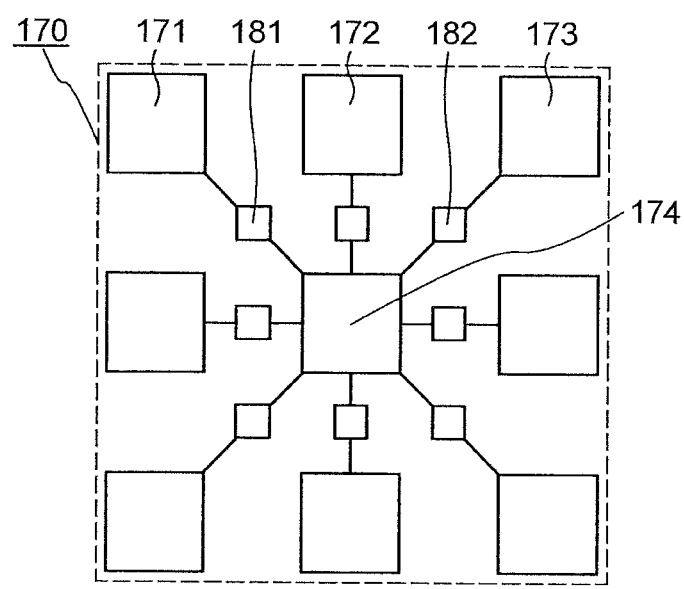
FIG. 8 is a block diagram relating to an example of a semiconductor device.

An integrated semiconductor device 170 which is a modification example of the semiconductor device shown in the foregoing embodiment (for example, Embodiment 1) is shown in FIG. 8. Specific examples of the integrated semiconductor device 170 are a CPU, an MPU and the like.

The semiconductor device 170 includes a plurality of circuit blocks such as circuit blocks 171 to 174 and the like. In addition, the circuit blocks are electrically connected to each other through an element using an oxide semiconductor at least in a part thereof such as a switching element 181, a switching element 182 and the like.

For the circuit blocks 171 to 174, an integrated circuit including the CMOS inverter circuits C1 to Cn and the like can be used, for example. Alternatively, a memory circuit or the like typified by DRAM may also be applied. Each circuit blocks needs to have an appropriate function depending on the required properties.

For the switching element 181 and the switching element 182, the switching transistor S1 can be used, for example. At least a part of the switching element 181 and the switching element 182 are preferably formed using an oxide semiconductor, particularly, a highly purified oxide semiconductor.

The semiconductor device 170 shown in FIG. 8 is only an example in which the configuration is simplified, and an actual semiconductor device may have various configurations depending on the uses.

At least a part of the semiconductor device 170 is formed using an oxide semiconductor, particularly, a highly purified oxide semiconductor and standby power thereof is sufficiently suppressed. As described in the foregoing embodiment, an effect of suppressing standby power in an integrated and complicated semiconductor device is extremely large.

The structures, methods and the like shown in this embodiment can be combined as appropriate with any of the structures, methods and the like shown in the other embodiments.

Embodiment 4

Next, another example of a method for manufacturing a transistor using an oxide semiconductor which can be used as the switching transistor S1 in the foregoing embodiment (such as Embodiment 1) is described with reference to FIGS. 9A to 9E. In this embodiment, the case where a highly purified oxide semiconductor (specifically an oxide semiconductor having an amorphous structure) is used is described in detail. Note that hereinafter, a top-gate transistor is described as an example but a structure of the transistor is not necessarily limited to a top-gate transistor.

First, an insulating layer 202 is formed over a lower layer substrate 200. Then an oxide semiconductor layer 206 is formed over the insulating layer 202 (see FIG. 9A).

For example, the lower layer substrate 200 can be a structure body in a portion lower than the interlayer insulating layer 128 in the semiconductor device of the foregoing embodiment (the semiconductor device shown in FIG. 2A and the like). The foregoing embodiment can be referred to for the details.

The insulating layer 202 functions as a base and is formed in the same manner as the gate insulating layer 138, the protective insulating layer 144 and the like in the foregoing embodiment. The foregoing embodiment may be referred to for a detailed description. Note that the insulating layer 202 is preferably formed containing as little hydrogen or water as possible.

As the oxide semiconductor layer 206, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer or a Sn—Al—Zn—O-based oxide semiconductor layer which are three-component metal oxide; an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer or an In—Mg—O-based oxide semiconductor layer which are two-component metal oxide; or an In—O-based oxide semiconductor layer, a Sn—O-based oxide semiconductor layer or a Zn—O-based oxide semiconductor layer which are single-component metal oxide can be used.

In particular, an In—Ga—Zn—O-based oxide semiconductor material has sufficiently high resistance when there is no electric field and thus off state current can be sufficiently reduced. In addition, with high field effect mobility, the In—Ga—Zn—O-based oxide semiconductor material is suitable for a semiconductor device.

As the oxide semiconductor layer, a thin film represented by $InMO_3(ZnO)_m$ (m>0 and in is not a natural number) can be used. Here, M is one or more metal elements selected from Ga, Al, Mn and Co. For example, as M, Ga, Ga and Al, Ga and Mn, and Ga and Co are given. A material represented by $InGa_xZn_yO_z$ can also be used. Here, x, y and z are given numbers. In addition, x, y, and z do not necessarily be integers and may be non-integers. Note that x may be zero but y is preferably not zero. For example, the expression $InGa_xZn_yO_z$ includes In—Zn—O in which x is zero. The oxide semiconductor material represented by In—Ga—Zn—O described in this specification is $InGaO_3(ZnO)_m$ (m>0 and m is not a natural number). The fact that m is not a natural number can be confirmed by analysis using ICP-MS or RBS. Further, the expression $InGa_xZn_yO_z$ includes cases where x=1 and y=1, x=1 and y=0.5 and the like. Note that the above described composition is derived from a crystal structure and is just an example.

In this embodiment, the oxide semiconductor layer 206 having an amorphous structure is formed by a sputtering method using a target for forming an In—Ga—Zn—O-based oxide semiconductor.

As a target for forming an In—Ga—Zn—O-based oxide semiconductor layer 206 by a sputtering method, a target which can be represented by a compositional formula In:Ga:Zn=1:x:y (x is zero or more, y is 0.5 or more and 5 or less) can be used. For example, a target with a relative proportion of In:Ga:Zn=1:1:1 [atom ratio] (x=1, y=1), that is, $In_2O_3$:$Ga_2O_3$:ZnO=1:1:2 [molar ratio] may be used. In addition, a target with a relative proportion of In:Ga:Zn=1:1:0.5 [atom ratio] (x=1, y=0.5), a target with a relative proportion of In:Ga:Zn=1:1:2 [atom ratio] (x=1, y=2) or a target with a relative proportion of In:Ga:Zn=1:0:1 [atom ratio] (x=0, y=1) can also be used.

It is preferable that a metal oxide semiconductor contained in the oxide semiconductor target for film formation has a relative density of 80% or more, preferably 95% or more, more preferably 99.9% or more. With use of a target for forming an oxide semiconductor with high relative density, the oxide semiconductor layer 206 having a dense structure can be formed.

An atmosphere for formation of the oxide semiconductor layer 206 is preferably a rare gas (typically argon) atmosphere, an oxygen atmosphere or a mixed atmosphere of a rare gas (typically argon) and oxygen. Specifically, an atmosphere of a high-purity gas is preferable in which the concentration of impurities such as hydrogen, water, hydroxyl and hydride is reduced to a concentration of approximately several parts per million (preferably several parts per billion).

At the time of forming the oxide semiconductor layer 206, for example, the substrate is fixed in a treatment chamber which is kept in a reduced-pressure state and heated so that the substrate temperature is 100° C. or higher and 600° C. or lower, preferably 200° C. or higher and 400° C. or lower. While moisture remaining in the treatment chamber is removed, a sputtering gas from which hydrogen, moisture and the like are removed is introduced, and the oxide semiconductor layer 206 is formed with use of the target. By forming the oxide semiconductor layer 206 while the substrate is heated, the concentration of impurities contained in the oxide semiconductor layer 206 can be reduced. In addition, damage of the oxide semiconductor layer 206 due to sputtering is reduced. In order to remove remaining moisture in the treatment chamber, an entrapment vacuum pump is preferably used. For example, a cryopump, an ion pump or a titanium sublimation pump can be used. The evacuation unit may be a turbo pump provided with a cold trap. Hydrogen, water and the like are removed from the deposition chamber by evacuating with the cryopump, so that the concentration of impurities contained in the oxide semiconductor layer 206 can be reduced.

For example, the film formation conditions of the oxide semiconductor layer 206 can be set as follows: the distance between a substrate and a target is 170 mm; the pressure is 0.4 Pa; the direct-current (DC) power is 0.5 kW; and the atmosphere is an oxygen atmosphere (the flow rate ratio of oxygen is 100%) or an argon atmosphere (the flow rate ratio of argon is 100%). It is preferable that a pulsed direct-current (DC) power supply be used because powder substances (also referred to as particles or dust) can be reduced and a variation of the film thickness can be decreased. The thickness of the oxide semiconductor layer 206 is 2 nm or more and 200 nm or less, preferably 5 nm or more and 30 nm or less. Note that an appropriate thickness depends on an oxide semiconductor material to be applied, the intended use of the semiconductor device or the like, and thus the thickness of the oxide semiconductor layer may be set as appropriate depending on the material to be used, the intended use or the like.

Note that before the oxide semiconductor layer 206 is formed by a sputtering method, a material attached to a surface of the insulating layer 202 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere or the like may be used instead of the argon atmosphere.

Next, an island-shaped oxide semiconductor layer 206a is formed by processing the oxide semiconductor layer 206 by an etching or the like with use of a mask.

For the etching of the oxide semiconductor layer 206, either dry etching or wet etching may be used. Needless to say, a combination of dry etching and wet etching may be employed. The etching conditions (an etching gas, etching solution, etching time, temperature or the like) may be set as appropriate, depending on the material so that the oxide semiconductor layer can be etched into a desired shape. The foregoing embodiment can be referred to for a detailed description thereof. The etching of the oxide semiconductor layer 206 can be performed in the same manner as the etching of the semiconductor layer in the foregoing embodiment. The foregoing embodiment may be referred to for a detailed description.

After that, the oxide semiconductor layer 206a is desirably subjected to heat treatment (first heat treatment). Excessive hydrogen (including water and hydroxyl group) in the oxide semiconductor layer 206a is removed by the first heat treatment and a structure of the oxide semiconductor is improved, so that defect level in energy gap of the oxide semiconductor layer 206a can be reduced. The first heat treatment is performed for example, at a temperature 300° C. or higher and 750° C. or lower, preferably 400° C. or higher and 700° C. or lower.

The first heat treatment can be performed in such a way that, for example, the lower layer substrate 200 is introduced into an electric furnace using a resistance heating element or the like and heated, under a nitrogen atmosphere at 450° C. for an hour. During the first heat treatment, the oxide semiconductor layer 206a is not exposed to the air to prevent the entry of water and hydrogen.

Note that a heat treatment apparatus is not necessary limited to an electrical furnace, and may include a device for heating an object to be processed by heat conduction or heat radiation given by a medium such as a heated gas or the like. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA treatment may be performed as follows. The substrate is placed in an inert gas atmosphere which has been heated to a high temperature of 650° C. to 700° C., heated for several minutes, and taken out from the inert gas atmosphere. GRTA treatment enables high-temperature heat treatment for a short time. Moreover, the GRTA treatment can be employed even when the temperature exceeds the upper temperature limit of the substrate because the heat treatment can be achieved in a short time. Note that the inert gas may be switched to a gas including oxygen during the process. This is because defect level in energy gap due to oxygen deficiency can be reduced by performing the first heat treatment in an atmosphere including oxygen.

Note that the inert gas atmosphere is preferably an atmosphere which contains nitrogen or a rare gas (such as helium, neon or argon) as its main component and does not contain water, hydrogen or the like. For example, the purity of nitrogen or a rare gas such as helium, neon or argon introduced into a heat treatment apparatus is 6N (99.9999%) or more, preferably 7N (99.99999%) or more (that is, the concentration of the impurities is 1 ppm or less, preferably 0.1 ppm or less).

In any case, impurities are reduced by the first heat treatment and an i-type or substantially i-type oxide semiconductor layer 206a is formed, so that a transistor having excellent characteristics can be realized.

Note that the first heat treatment may be performed on the oxide semiconductor layer 206 which has not yet been processed into the island-shaped oxide semiconductor layer 206a. In that case, after the first heat treatment, the lower layer substrate 200 is taken out of the heating apparatus and subjected to a photolithography step.

The first heat treatment has an effect of removing hydrogen, water and the like and can be referred to as dehydration treatment, dehydrogenation treatment or the like. The dehydration treatment or the dehydrogenation treatment can be performed after a source electrode and a drain electrode are stacked over the oxide semiconductor layer 206a. Further, such dehydration treatment or dehydrogenation treatment may be conducted once or plural times.

Next, a conductive layer is formed to be in contact with the oxide semiconductor layer 206a. The conductive layer is selectively etched, whereby a source or drain electrode 208a and a source or drain electrode 208b are formed (see FIG. 9B). The step is the same as the step relating to the source or drain electrode 142a and the like. The foregoing embodiment can be referred to for a detailed description.

Figure 9A:
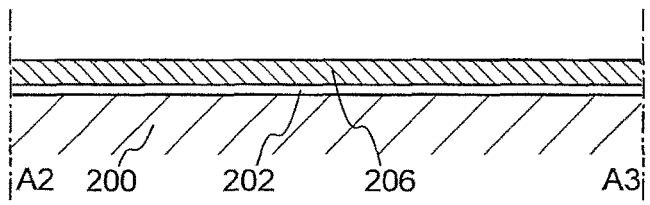
FIGS. 9A to 9E are cross-sectional views relating to manufacturing steps of a semiconductor device.
Figure 9B:
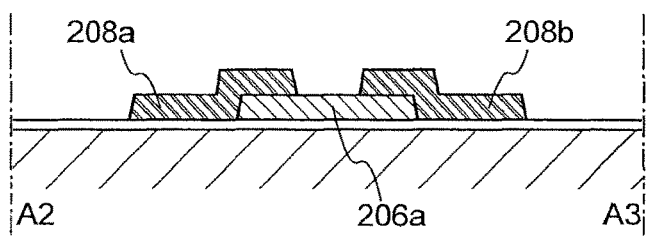
Figure 9C:
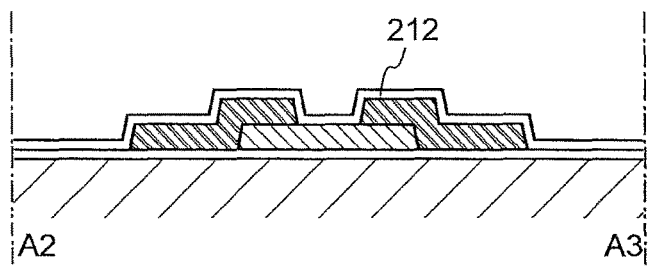

Next, a gate insulating layer 212 which is in contact with part of the oxide semiconductor layer 206a is formed (see FIG. 9C). The description regarding the gate insulating layer 138 of the foregoing embodiment can be referred to for a detailed description.

The formed gate insulating layer 212 is desirably subjected to second heat treatment in an inert gas atmosphere or an oxygen atmosphere. The second heat treatment is performed at a temperature 200° C. or higher and 450° C. or lower, preferably 250° C. or higher and 350° C. or lower. For example, the second heat treatment is performed at 250° C. for an hour in a nitrogen atmosphere. The second heat treatment can reduce variation in electric characteristics of the transistor. In addition, in the case where the gate insulating layer 212 contains oxygen, oxygen is supplied to the oxide semiconductor layer 206a and oxygen deficiency of the oxide semiconductor layer 206a is filled, whereby an i-type oxide semiconductor layer (an intrinsic semiconductor) or an oxide semiconductor layer which is extremely close to an i-type can be formed.

Note that in this embodiment, the second heat treatment is performed after the gate insulating layer 212 is formed; however, timing of the second heat treatment is not limited thereto.

Figure 9D:
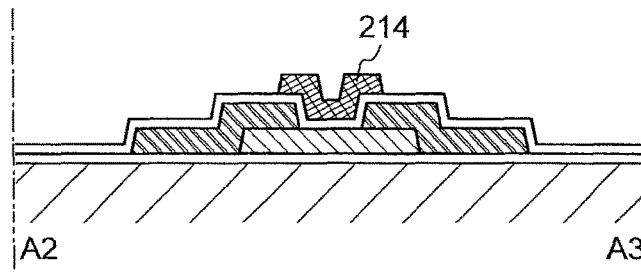

Next, a gate electrode 214 is formed in a region over the gate insulating layer 212 which overlaps with the oxide semiconductor layer 206a (see FIG. 9D). The gate electrode 214 can be formed after a conductive layer is formed over the gate insulating layer 212 and then selectively patterned. The description regarding the gate electrode 136c and the gate electrode 145 of the foregoing embodiment can be referred to for a detailed description.

Figure 9E:
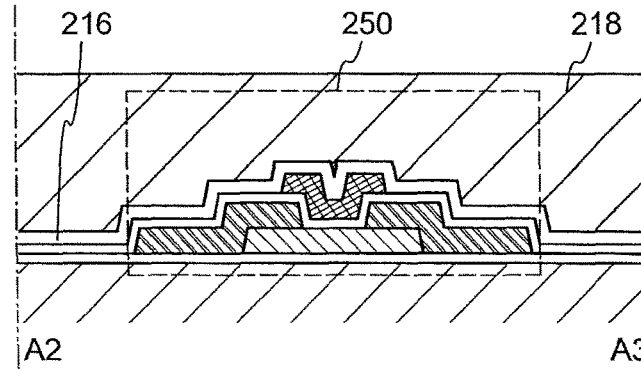

Next, an interlayer insulating layer 216 and an interlayer insulating layer 218 are formed over the gate insulating layer 212 and the gate electrode 214 (see FIG. 9E). The interlayer insulating layer 216 and the interlayer insulating layer 218 can be formed using a PVD method, a CVD method or the like. A material containing an inorganic insulating material such as silicon oxide, silicon oxynitride, silicon nitride, hafnium oxide, aluminum oxide or tantalum oxide can be used for the interlayer insulating layer 216 and the interlayer insulating layer 218. Note that in this embodiment, a stacked-layer structure of the interlayer insulating layer 216 and the interlayer insulating layer 218 is employed but the disclosed invention is not limited thereto. A single-layer structure, a stacked layer structure of two layers may also be used.

Note that the interlayer insulating layer 218 is desirably formed so as to have a planarized surface. This is because an electrode, a wiring or the like can be favorably formed over the interlayer insulating layer 218 by forming the interlayer insulating layer 218 to have a planarized surface.

Through the above process, a transistor 250 using a highly purified oxide semiconductor layer 206a is completed.

The transistor 250 shown in FIG. 9E includes the following components: the oxide semiconductor layer 206a provided over the lower layer substrate 200 with the insulating layer 202 interposed therebetween; the source or drain electrode 208a and the source or drain electrode 208b both of which are electrically connected to the oxide semiconductor layer 206a; the gate insulating layer 212 covering the oxide semiconductor layer 206a, the source or drain electrode 208a and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

Since the oxide semiconductor layer 206a is highly purified, the hydrogen concentration of the transistor 250 shown in this embodiment is $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 206a (for example, less than $1 \times 10^{12}$/cm$^3$, preferably less than $1.45 \times 10^{10}$/cm$^3$) is sufficiently less than that of general silicon wafer (approximately $1 \times 10^{14}$/cm$^3$). Because of this, the off state current is sufficiently reduced. For example, in the case where a channel length is 10 μm and the thickness of an oxide semiconductor layer is 30 nm, when the range of a drain voltage is approximately 1 V to 10 V, the off state current (drain current of when a voltage between a gate and a source is 0 V or less) is $1 \times 10^{-13}$ A or less. Furthermore, an off state current density (the value obtained by dividing the off state current with the channel width) at a room temperature is 100 aA (1 aA (attoampere) is $10^{-18}$ A (ampere))/μm or less, preferably 10 aA/μm or less, more preferably, 1 aA/μm or less.

Note that the characteristics of the transistor can be represented using off state resistance (resistance value when the transistor is turned off) or off state resistivity (resistivity when the transistor is turned off) besides off state current or off state current density. Here, off state resistance R can be obtained by Ohm's law using off state current and drain voltage. Further, off state resistivity ρ can be obtained by formula ρ=RA/L using a cross sectional area A of a channel formation region and a channel length L. Specifically, in the above case, off state resistivity is $1 \times 10^{9}$ Ω·m or more (alternatively, $1 \times 10^{10}$ Ω·m or more). Note that the cross sectional area A is represented by A=dW using the thickness d of an oxide semiconductor layer and a channel width W.

When such a highly purified intrinsic oxide semiconductor layer 206a is used, the off state current of the transistor can be sufficiently reduced.

Note that in this embodiment, although the case where the transistor 250 is used instead of the transistor 162 shown in the foregoing embodiment is described, the disclosed invention is not necessarily construed as being limited thereto. For example, an oxide semiconductor can be used for all transistors including a transistor included in an integrated circuit by the electric characteristics being sufficiently increased. In such a case, the transistors do not need to be a stacked-layer structure as described in the foregoing embodiment. Note that field effect mobility μ of a transistor including an oxide semiconductor is preferably μ>100 cm$^2$/V·s in order to realize favorable circuit operation. In this case, the semiconductor device can be formed using a glass substrate or the like.

The structures, methods and the like shown in this embodiment can be combined as appropriate with any of the structures, methods and the like shown in the other embodiments.

Embodiment 5

Next, an example of a method for manufacturing a transistor using an oxide semiconductor which can be used as the switching transistor S1 in the foregoing embodiment (such as Embodiment 1) is described with reference to FIGS. 10A to 10E. In this embodiment, the case where a first oxide semiconductor layer having a crystal region and a second oxide semiconductor layer obtained by crystal growth from the crystal region of the first oxide semiconductor layer are used as the oxide semiconductor layer is described in detail. Note that hereinafter, a top-gate transistor is described as an example but a structure of the transistor is not necessarily limited to a top-gate transistor.

First, an insulating layer 302 is formed over a lower layer substrate 300. After that, a first oxide semiconductor layer is formed over the insulating layer 302 and first heat treatment is performed to crystallize at least a region including a surface of the first oxide semiconductor layer, so that a first oxide semiconductor layer 304 is formed (see FIG. 10A).

For example, the lower layer substrate 300 can be a structure body in a portion lower than the interlayer insulating layer 128 in the semiconductor device of the foregoing embodiment (the semiconductor device shown in FIG. 2A and the like). The foregoing embodiment can be referred to for the details.

The insulating layer 302 functions as a base and is formed in the same manner as the insulating layer 138, the protective insulating layer 144 or the like in the foregoing embodiment. The foregoing embodiment may be referred to for a detailed description. Note that the insulating layer 302 is preferably formed containing as little hydrogen or water as possible.

The first oxide semiconductor layer 304 can be formed in the same manner as the oxide semiconductor layer 206 in the foregoing embodiment. The foregoing embodiment may be referred to for the details of the first oxide semiconductor layer 304 and the film formation method thereof. Note that in this embodiment, the first oxide semiconductor layer 304 is intentionally crystallized by the first heat treatment; thus, a target for film formation of an oxide semiconductor which can be easily crystallized is preferably used to form the first oxide semiconductor layer 304. In addition, the thickness of the first oxide semiconductor layer 304 is preferably 3 nm or more and 15 nm or less. In this embodiment, the first oxide semiconductor layer 304 has a thickness of 5 nm as an example. Note that an appropriate thickness differs depending on an oxide semiconductor material to be applied, the intended use of the semiconductor device or the like, and thus the thickness is set as appropriate depending on the material to be used, the intended use or the like.

The first heat treatment is performed at a temperature of 450° C. or higher and 850° C. or lower, preferably 550° C. or higher and 750° C. or lower. The heat treatment is preferably performed for one minute or more and 24 hours or less. The atmosphere of the first heat treatment is preferably an atmosphere in which hydrogen, water and the like are not included. For example, the atmosphere can be a nitrogen atmosphere, an oxygen atmosphere, an atmosphere of a rare gas (such as helium, neon, and argon) or the like from which water is sufficiently removed.

For a heat treatment apparatus, a device for heating an object to be processed by heat conduction or heat radiation given by a medium such as a heated gas or the like can be used besides an electrical furnace. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

At least the region including the surface of the first oxide semiconductor layer 304 is crystallized by the first heat treatment. The crystal grows from the surface of the first oxide semiconductor layer 304 to the inside of the first oxide semiconductor layer 304, whereby the crystal region is formed. Note that the crystal region contains a plate-like crystal whose average thickness is 2 nm or more and 10 nm or less, in some cases. In addition, the crystal region contains a crystal whose c-axis is aligned a direction perpendicular to the surface of the oxide semiconductor layer, in some cases.

Further, it is preferable that hydrogen (including water and hydroxyl group) and the like be removed from the first oxide semiconductor layer 304 while the crystal region be formed by the first heat treatment. In the case where hydrogen and the like are removed, the first heat treatment may be performed in an atmosphere such as a nitrogen atmosphere, an oxygen atmosphere and an atmosphere of a rare gas (such as helium, neon and argon) with a purity of 6N (99.9999%) or more (that is, the concentration of the impurities is 1 ppm or less). More preferably, an atmosphere with a purity of 7N (99.99999%) or more (that is, the concentration of the impurities is 0.1 ppm or less) may be used. Furthermore, the first heat treatment may be performed in ultra-dry air with an $H_2O$ concentration of 20 ppm or lower, preferably 1 ppm or lower.

In addition, it is preferable that oxygen be supplied to the first oxide semiconductor layer 304 while the crystal region be formed by the first heat treatment. For example, oxygen can be supplied to the first oxide semiconductor layer 304 by changing the atmosphere of the heat treatment to an oxygen atmosphere or the like.

In this embodiment, a heat treatment is performed at 700° C. for an hour under a nitrogen atmosphere as the first heat treatment and hydrogen and the like are removed from the oxide semiconductor layer. After that, oxygen is supplied to inside of the first oxide semiconductor layer 304 by changing the atmosphere to an oxygen atmosphere. Note that a main object of the first heat treatment is a formation of the crystal region, so that another treatment whose object is removal of hydrogen and the like and supply of oxygen can be additionally performed. For example, a heat treatment for crystallization can be performed after a heat treatment for removing hydrogen and the like and treatment for supplying oxygen are performed.

The first oxide semiconductor layer 304 which has the crystal region and from which hydrogen (including water and hydroxyl group) and the like are removed and to which oxygen is supplied can be obtained by such first heat treatment.

Figure 10A:
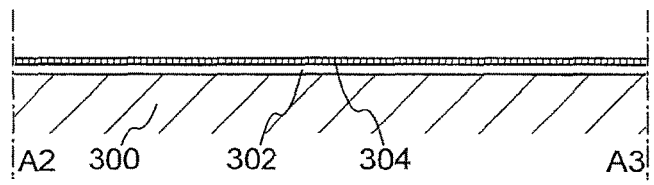
FIGS. 10A to 10E are cross-sectional views relating to manufacturing steps of a semiconductor device.
Figure 10B:
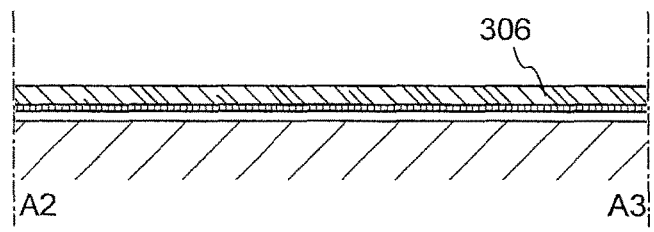

Next, the second oxide semiconductor layer 306 is formed over the first oxide semiconductor layer 304 having the crystal region at least in the region including the surface (see, FIG. 10B).

The second oxide semiconductor layer 306 can be formed in the same manner as the oxide semiconductor layer 206 in the foregoing embodiment. The foregoing embodiment may be referred to for the details of the second oxide semiconductor layer 306 and the film formation method thereof. Note that the second oxide semiconductor layer 306 is preferably formed to have a thickness larger than that of the first oxide semiconductor layer 304. Further, it is preferable that the second oxide semiconductor layer 306 be formed so that the sum of the thicknesses of the first oxide semiconductor layer 304 and the second oxide semiconductor layer 306 is 3 nm or more and 50 nm or less. Note that an appropriate thickness differs depending on an oxide semiconductor material, the intended use or the like, and thus the thickness is set as appropriate depending on the material, the intended use or the like.

For the second oxide semiconductor layer 306, a material having the same main component as that of the first oxide semiconductor layer 304, for example, a material whose lattice constant after crystallization is close to that of the first oxide semiconductor layer 304 (lattice mismatch is 1% or less) is preferably used. This is because, in the case where the material having the same main component is used, a crystal can be easily grown in crystallization of the second oxide semiconductor layer 306 by using the crystal region of the first oxide semiconductor layer 304 as a seed. Moreover, in the case where the material having the same main component is used, physical properties of an interface and electrical characteristics between the first oxide semiconductor layer 304 and the second oxide semiconductor layer 306 are favorable.

Note that when a desired film quality is obtained by the crystallization, a material having a different main component may be used to form the second oxide semiconductor layer 306.

Figure 10C:
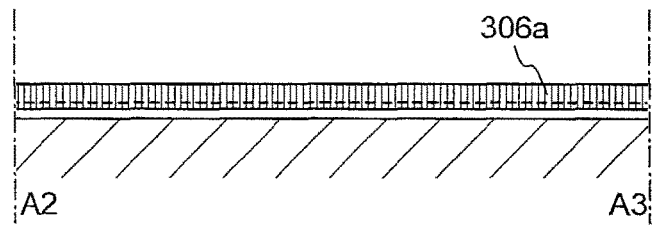

Next, a second heat treatment is performed to the second oxide semiconductor layer 306, so that the crystal is grown by using the crystal region of the first oxide semiconductor layer 304 as a seed to form a second oxide semiconductor layer 306a (see FIG. 10C).

The temperature of the second heat treatment is 450° C. or higher and 850° C. or lower, preferably 600° C. or higher and 700° C. or lower. The second heat treatment is performed for one minute or more and 100 hours or less, preferably 5 hours or more and 20 hours or less and typically, for 10 hours. Note that it is preferable that also in the second heat treatment, hydrogen, water and the like be not contained in the treatment atmosphere.

Details of the atmosphere and the effect of the heat treatment are the same as that of the first heat treatment. A heat treatment apparatus which can be used is the same as that of the first heat treatment. For example, at the time of increasing the temperature of the second heat treatment, an atmosphere inside a furnace is set to a nitrogen atmosphere and at the time of performing cooling, the atmosphere of the furnace is set to an oxygen atmosphere. Consequently, hydrogen and the like can be removed under a nitrogen atmosphere and oxygen can be supplied under an oxygen atmosphere.

The second heat treatment as described the above is performed, whereby the crystal is grown from the crystal region formed in the first oxide semiconductor layer 304 to the whole area of the second oxide semiconductor layer 306; thus, the second oxide semiconductor layer 306a can be formed. Further, the second oxide semiconductor layer 306a from which hydrogen (including water and hydroxyl group) is removed and to which oxygen is supplied can be formed. Furthermore, orientation of the crystal region of the first oxide semiconductor layer 304 can be increased by performing second heat treatment.

For example, in the case where an In—Ga—Zn—O-based oxide semiconductor material is used for the second oxide semiconductor layer 306a, the second oxide semiconductor layer 306a can contain a crystal represented by $InGaO_3(ZnO)_m$ (m>0 and m is not a natural number), a crystal represented by $In_2Ga_2ZnO_7$ (In:Ga:Zn:O=2:2:1:7) and the like. Such crystals are aligned so that its c-axis is perpendicular to a surface of a second oxide semiconductor layer 306b by the second heat treatment.

Here, the crystals include any of In, Ga and Zn, and can be considered to have a stacked-layer structure of layers parallel to a-axis and b-axis. Specifically, the crystals have a structure in which a layer containing In and a layer which does not containing In (a layer containing Ga or Zn) are stacked in a direction of c-axis.

In an In—Ga—Zn—O-based oxide semiconductor crystal, conductivity in a direction parallel to a-axis and b-axis of a layer containing In is favorable. This is due to the fact that electrical conductivity is mainly controlled by In in an In—Ga—Zn—O-based oxide semiconductor crystal and the fact that the 5 s orbital of one In atom overlaps with the 5 s orbital of an adjacent In atom and thereby a carrier path is formed.

Further, in the case where the first oxide semiconductor layer 304 has a structure including an amorphous region at an interface with the insulating layer 302, the crystal grows from the crystal region formed at the surface of the first oxide semiconductor layer 304 toward a bottom portion of the first oxide semiconductor layer 304 by the second heat treatment, whereby the amorphous region is crystallized in some cases. Note that the amorphous region remains in some cases depending on a material included in the insulating layer 302, a condition of the second heat treatment or the like.

In the case where an oxide semiconductor material having the same main component is used for the first oxide semiconductor layer 304 and the second oxide semiconductor layer 306, the first oxide semiconductor layer 304 and the second oxide semiconductor layer 306a have the same crystal structure in some cases, as shown in FIG. 10C. Therefore, although boundary between the first oxide semiconductor layer 304 and the second oxide semiconductor layer 306a is indicated by a dotted line in FIG. 10C, the boundary cannot be found, therefore the first oxide semiconductor layer 304 and the second oxide semiconductor layer 306a can be regarded as the same layer in some cases.

Figure 10D:
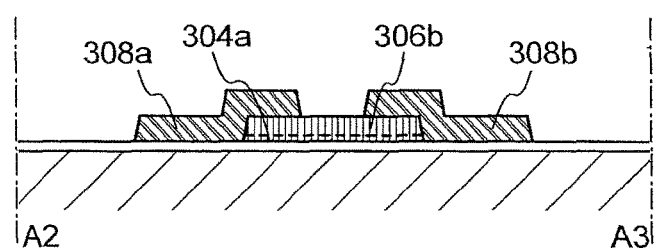

Next, the first oxide semiconductor layer 304 and the second oxide semiconductor layer 306a are processed by a method such as an etching using a mask, so that an island-shaped first oxide semiconductor layer 304a and an island-shaped second oxide semiconductor layer 306b are formed (see FIG. 10D).

For the etching of the first oxide semiconductor layer 304 and the second oxide semiconductor layer 306a, either dry etching or wet etching may be used. Needless to say, a combination of dry etching and wet etching may be employed. The etching conditions (an etching gas, etching solution, etching time, temperature or the like) may be set as appropriate, depending on the material so that the oxide semiconductor layer can be etched into a desired shape. The etching of the first oxide semiconductor layer 304 and the second oxide semiconductor layer 306a can be performed in the same manner as the etching of the semiconductor layer in the foregoing embodiment. The foregoing embodiment may be referred to for a detailed description.

Note that among the oxide semiconductor layer, a region to be a channel formation region preferably has a flat surface. For example, in a region overlapping with a gate electrode (the channel formation region), a difference in height of the surface of the second oxide semiconductor layer 306b is preferably 1 nm or less (more preferably, 0.2 nm or less).

Next, a conductive layer is formed so as to be in contact with the second oxide semiconductor layer 306b. After that, the conductive layer is selectively etched, whereby a source or drain electrode 308a and a source or drain electrode 308b are formed (see, FIG. 10D). The source or drain electrodes 308a and 308b can be formed in the same manner as that of the source or drain electrodes 142a and 142b in the foregoing embodiment. The foregoing embodiment may be referred to for a detailed description.

In some cases, during a step shown in FIG. 10D, a crystal layer contacting with the source or drain electrode 308a and the source or drain electrode 308b becomes an amorphous state at the side surface of the first oxide semiconductor layer 304a and the second oxide semiconductor layer 306b. Therefore, the whole region of the first oxide semiconductor layer 304a and the second oxide semiconductor layer 306b does not always have a crystal structure.

Subsequently, a gate insulating layer 312 contacting with part of the second oxide semiconductor layer 306b is formed. The gate insulating layer 312 can be formed using a CVD method, sputtering method or the like. After that, a gate electrode 314 is formed in a region over the gate insulating layer 312 which overlaps with the first oxide semiconductor layer 304a and the second oxide semiconductor layer 306b. An interlayer insulating layer 316 and an interlayer insulating layer 318 are formed over the gate insulating layer 312 and the gate electrode 314 (see FIG. 10E). The gate insulating layer 312, the gate electrode 314 and the interlayer insulating layers 316 and 318 can be formed in the same manner as the gate insulating layer 138, the gate electrode 136c, the gate electrode 145 and the interlayer insulating layers 216 and 218 in the forgoing embodiment. The foregoing embodiment may be referred to for a detailed description.

The formed gate insulating layer 312 is desirably subjected to third heat treatment in an inert gas atmosphere or an oxygen atmosphere. The third heat treatment is performed at a temperature 200° C. or higher and 450° C. or lower, preferably 250° C. or higher and 350° C. or lower. For example, the heat treatment is performed at 250° C. for an hour in an atmosphere containing oxygen. The third heat treatment can reduce variation in electric characteristics of the transistor. In addition, in the case where the gate insulating layer 312 contains oxygen, oxygen is supplied to the second oxide semiconductor layer 306b and oxygen deficiency of the second oxide semiconductor layer 306b is filled, whereby an i-type (an intrinsic semiconductor) oxide semiconductor layer or an oxide semiconductor layer which is extremely close to an i-type can be formed.

Note that in this embodiment, the third heat treatment is performed after the gate insulating layer 312 is formed; however, timing of the third heat treatment is not limited thereto. Alternatively, in the case where oxygen is already supplied to the second oxide semiconductor layer by another treatment such as the second heat treatment, the third heat treatment may be omitted.

In such a manner, a transistor 350 using the first oxide semiconductor layer 304a and the second oxide semiconductor layer 306b obtained by crystal growth from the crystal region of the first oxide semiconductor layer 304a is completed.

Figure 10E:
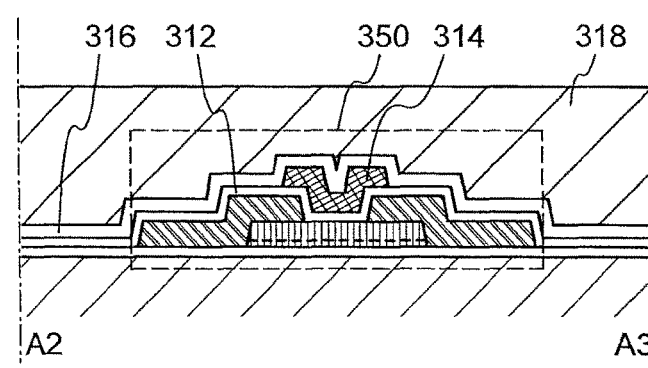

The transistor 350 shown in FIG. 10E includes the following components: the first oxide semiconductor layer 304a provided over the lower layer substrate 300 with the insulating layer 302 interposed therebetween; the second oxide semiconductor layer 306b provided over the first oxide semiconductor layer 304a; the source or drain electrode 308a and the source or drain electrode 308b are electrically connected to the second oxide semiconductor layer 306b; the gate insulating layer 312 covering the second oxide semiconductor layer 306b, the source or drain electrode 308a and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 shown in this embodiment, since the first oxide semiconductor layer 304a and the second oxide semiconductor layer 306b are highly purified, the hydrogen concentration is $5 \times 10^{19}$ atoms/cm$^3$ or less, preferably $5 \times 10^{18}$ atoms/cm$^3$ or less, and more preferably $5 \times 10^{17}$ atoms/cm$^3$ or less. In addition, the carrier density of the oxide semiconductor layer 206a (for example, less than $1 \times 10^{12}$/cm$^3$, preferably less than $1.45 \times 10^{10}$/cm$^3$) is sufficiently less than that of general silicon wafer (approximately $1 \times 10^{14}$/cm$^3$). Because of this, the off state current is sufficiently reduced. For example, in the case where a channel length is 10 μm and the thickness of an oxide semiconductor layer is 30 nm, when the range of a drain voltage is approximately 1 V to 10 V, the off state current (drain current of when a voltage between a gate and a source is 0 V or less) is $1 \times 10^{-13}$ A or less. Furthermore, an off state current density (the value obtained by dividing the off state current with the channel width) at a room temperature is 100 aA (1 aA (attoampere) is $10^{-18}$ A (ampere))/μm or less, preferably 10 aA/μm or less, more preferably, 1 aA/μm or less.

Note that the characteristics of the transistor can be represented using off state resistance (resistance value when the transistor is turned off) or off state resistivity (resistivity when the transistor is turned off) besides off state current or off state current density. Here, off state resistance R can be obtained by Ohm's law using off state current and drain voltage. Further, off state resistivity ρ can be obtained by formula ρ=RA/L using a cross sectional area A of a channel formation region and a channel length L. Specifically, in the above case, off state resistivity is $1 \times 10^9$ Ω·m or more (alternatively, $1 \times 10^{10}$ Ω·m or more). Note that the cross sectional area A is represented by A=dW using the thickness d of an oxide semiconductor layer and a channel width W.

When such a highly purified intrinsic first oxide semiconductor layer 304a and the second oxide semiconductor layer 306b are used, the off state current of the transistor can be sufficiently reduced.

Further, in this embodiment, the first oxide semiconductor layer 304a including the crystal region and the second oxide semiconductor layer 306b obtained by crystal growth from the crystal region of the first oxide semiconductor layer 304a are used as an oxide semiconductor layer, whereby field effect mobility can be increased and a transistor having favorable electric characteristics can be realized.

Note that in this embodiment, the transistor 350 is used instead of the transistor 162 shown in the foregoing embodiment is described; however, the disclosed invention is not necessary construed as being limited thereto. For example, the transistor 350 shown in this embodiment uses the first oxide semiconductor layer 304a including the crystal region and the second oxide semiconductor layer 306b obtained by crystal growth from the crystal region of the first oxide semiconductor layer 304a, so that the transistor 350 has favorable field effect mobility. Therefore, an oxide semiconductor can be used for all transistors including a transistor included in an integrated circuit. In such a case, the transistor does not need to be a stacked-layer structure as described in the foregoing embodiment. Note that field effect mobility μ of a transistor including an oxide semiconductor is preferably μ>100 cm$^2$/V·s in order to realize favorable circuit operation. In this case, the semiconductor device can be formed using a glass substrate or the like.

The structures, methods and the like shown in this embodiment can be combined as appropriate with any of the structures, methods and the like shown in the other embodiments.

Embodiment 6

In this embodiment, the case where the semiconductor device described in the above embodiments is applied to electronic appliances is described with reference to FIGS. 11A to 11F. The case where the above described semiconductor device is applied to electronic appliances such as a computer, a mobile phone set (also referred to as a mobile phone or a mobile phone device), a personal digital assistant (including a portable game machine, an audio reproducing device and the like), a digital camera, a digital video camera, electronic paper, a television set (also referred to as a television or a television receiver) and the like is described.

Figure 11A:
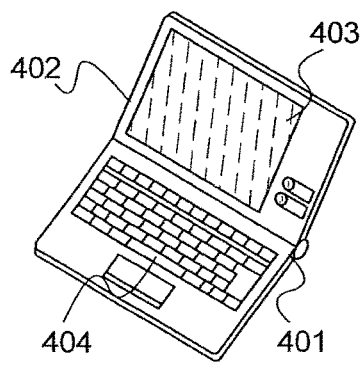
FIGS. 11A to 11F are diagrams for explaining electronic appliances.

FIG. 11A shows a notebook personal computer including a housing 401, a housing 402, a display portion 403, a keyboard 404 and the like. The semiconductor device shown in the foregoing embodiment is provided in the housing 401 and the housing 402. Thus, a notebook PC with sufficiently low power consumption can be realized.

Figure 11D:
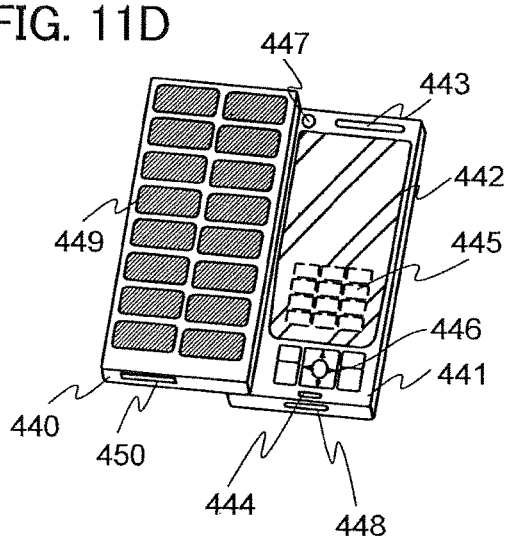
Figure 11B:
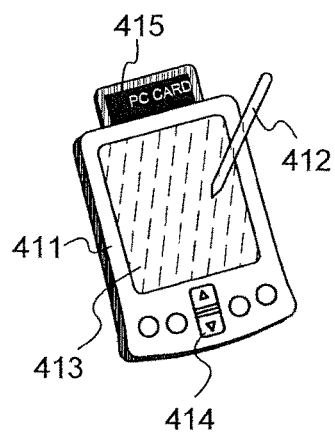

FIG. 11B shows a personal digital assistant (PDA) including a main body 411 provided with a display portion 413, an external interface 415, operation button 414 and the like. A stylus 412 and the like operating the personal digital assistant are also provided. The semiconductor device shown in the foregoing embodiment is provided in the main body 411. Therefore, a personal digital assistant with sufficiently low power consumption can be realized.

Figure 11E:
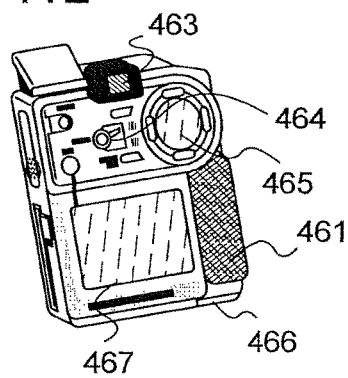
Figure 11C:
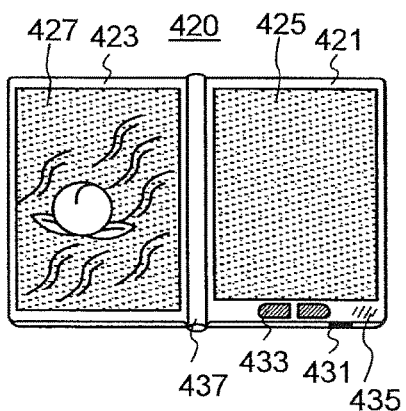

FIG. 11C shows an e-book reader 420 with electronic paper attached including two housings 421 and 423. The housings 421 and 423 are connected by a hinge portion 437 and can be opened or closed with the hinge portion 437. With such a structure, the e-book reader can be handled like a paper book. The housing 421 is provided with a power switch 431, operation keys 433, a speaker 435 and the like. The semiconductor device shown in the foregoing embodiment is provided at least in one of the housings 421 and 423. Therefore, an e-book reader with sufficiently low power consumption can be realized.

FIG. 11D is a mobile phone set including two housings 440 and 441. Moreover, the housings 440 and 441 which are shown unfolded in FIG. 11D can overlap with each other by sliding. Thus, the mobile phone can be in a suitable size for portable use. The housing 441 includes a display panel 442, a speaker 443, a microphone 444, a pointing device 446, a camera lens 447, an external connection terminal 448 and the like. The housing 440 is provided with a solar cell 449 for charging the mobile phone, an external memory slot 450 and the like. In addition, an antenna is incorporated in the housing 441. The semiconductor device shown in the foregoing embodiment is provided at least in one of the housings 440 and 441. Thus, a mobile phone set with sufficiently low power consumption can be realized.

FIG. 11E is a digital camera including a main body 461, a display portion 467, an eyepiece portion 463, an operation switch 464, a display portion 465, a battery 466 and the like. The semiconductor device shown in the foregoing embodiment is provided in the main body 461. Therefore, a digital camera with sufficiently low power consumption can be realized.

Figure 11F:
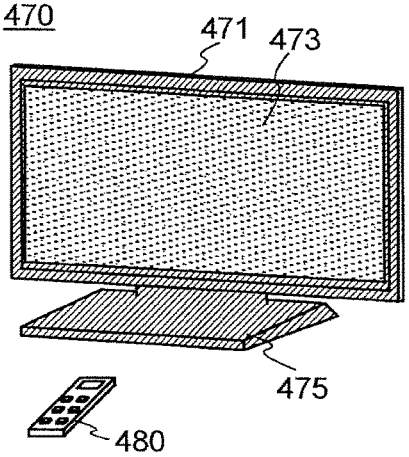

FIG. 11F is a television set 470 including a housing 471, a display portion 473, a stand 475 and the like. The television set 470 can be operated by an operation switch of the housing 471 and a separate remote controller 480. The semiconductor device shown in the foregoing embodiment is mounted in the housing 471 and the separate remote controller 480. Thus, a television set with sufficiently low power consumption can be realized.

As described above, an integrated circuit related to the foregoing embodiment is mounted in the electronic appliances shown in this embodiment. Therefore, an electronic appliance whose standby power is sufficiently reduced and power consumption is sufficiently reduced can be realized.

This application is based on Japanese Patent Application serial no. 2009-281949 filed with Japan Patent Office on Dec. 11, 2009, the entire contents of which are hereby incorporated by reference.

EXPLANATION OF REFERENCE

100: substrate, 102: protective layer, 104: semiconductor region, 106: element isolation insulating layer, 108: gate insulating layer, 110: gate electrode, 112: insulating layer, 114: impurity region, 116: channel formation region, 118: sidewall insulating layer, 120: high-concentration impurity region, 122: metal layer, 124: metal compound region, 126: interlayer insulating layer, 128: interlayer insulating layer, 130a: source or drain electrode, 130b: source or drain electrode, 132: insulating layer, 134: conductive layer, 136a: electrode, 136b: electrode, 136c: gate electrode, 138: gate insulating layer, 140: oxide semiconductor layer, 142a: source or drain electrode, 142b: source or drain electrode, 144: protective insulating layer, 145: gate electrode, 146: interlayer insulating layer, 148: conductive layer, 150a: electrode, 150b: electrode, 150c: electrode, 150d: electrode, 152: insulating layer, 154a: electrode, 154b: electrode, 154c: electrode, 160: transistor, 162: transistor, 170: semiconductor device, 171: circuit block, 172: circuit block, 173: circuit block, 174: circuit block, 181: switching element, 182: switching element, 200: lower layer substrate, 202: insulating layer, 206: oxide semiconductor layer, 206a: oxide semiconductor layer, 208a: source or drain electrode, 208b: source or drain electrode, 212: gate insulating layer, 214: gate electrode, 216: interlayer insulating layer, 218: interlayer insulating layer, 250: transistor, 300: lower layer substrate, 302: insulating layer, 304: first oxide semiconductor layer, 304a: first oxide semiconductor layer, 306: second oxide semiconductor layer, 306a: second oxide semiconductor layer, 306b: second oxide semiconductor layer, 308a: source or drain electrode, 308b: source or drain electrode, 312: gate insulating layer, 314: gate electrode, 316: interlayer insulating layer, 318: interlayer insulating layer, 350: transistor, 401: housing, 402: housing, 403: display portion, 404: keyboard, 411: main body, 412: stylus, 413: display portion, 414: operation button, 415: external interface, 420: e-book reader, 421: housing, 423: housing, 431: power switch, 433: operation keys, 435: speaker, 437: hinge portion, 440: housing, 441: housing, 442: display panel, 443: speaker, 444: microphone, 446: pointing device, 447: camera lens, 448: external connection terminal, 449: solar cell, 450: external memory slot, 461: main body, 463: eyepiece portion, 464: operation switch, 465: display portion, 466: battery, 467: display portion, 470: television set, 471: housing, 473: display portion, 475: stand, and 480: remote controller.

The invention claimed is:

1. A semiconductor device comprising:
a first circuit block;
a second circuit block; and
a transistor electrically connecting the first circuit block and the second circuit block, the transistor comprising:
a first oxide semiconductor layer; and
a second oxide semiconductor layer over the first oxide semiconductor layer,
wherein at least one of the first oxide semiconductor layer and the second oxide semiconductor layer comprises a crystalline structure.

2. The semiconductor device according to claim 1, wherein the crystalline structure is a non-single crystalline structure.

3. The semiconductor device according to claim 1, wherein at least one of the first oxide semiconductor layer and the second oxide semiconductor layer comprises indium, gallium, and zinc.

4. The semiconductor device according to claim 1, wherein an off state current of the transistor is $1 \times 10^{-13}$ A or less when a drain voltage is +1 V or +10 V and a gate voltage is in a range of −5 V to −20 V.

5. The semiconductor device according to claim 1, further comprising a gate electrode over the second oxide semiconductor layer.

6. The semiconductor device according to claim 1, further comprising a gate electrode, wherein the first oxide semiconductor layer is over the gate electrode.

7. The semiconductor device according to claim 1, wherein the semiconductor device is a CPU or an MPU.

8. The semiconductor device according to claim 1, wherein at least one of the first circuit block and the second circuit block comprises a memory circuit.

9. A semiconductor device comprising:
a first circuit block;
a second circuit block; and
a switching element,
wherein the first circuit block is electrically connected to the second circuit block through the switching element, and
wherein the switching element comprises a transistor comprising a first oxide semiconductor layer and a second oxide semiconductor layer over the first oxide semiconductor layer,
wherein the first oxide semiconductor layer comprises a first region in which a c-axis of a crystal is aligned a direction perpendicular to a surface of the first oxide semiconductor layer,
wherein the second oxide semiconductor layer comprises a second region in which a c-axis of a crystal is aligned a direction perpendicular to a surface of the second oxide semiconductor layer, and
wherein a lattice constant of a material in the first oxide semiconductor layer is different from a lattice constant of a material in the second oxide semiconductor layer.

10. The semiconductor device according to claim 9, wherein a lattice mismatch between the lattice constant of the material in the first oxide semiconductor layer and the lattice constant of the material in the second oxide semiconductor layer is 1% or less.

11. The semiconductor device according to claim 9, wherein each of the first region and the second region has a non-single crystalline structure.

12. The semiconductor device according to claim 9, wherein at least one of the first oxide semiconductor layer and the second oxide semiconductor layer comprises indium, gallium, and zinc.

13. The semiconductor device according to claim 9, wherein an off state current of the transistor is $1 \times 10^{-13}$ A or less when a drain voltage is +1 V or +10 V and a gate voltage is in a range of −5 V to −20 V.

14. The semiconductor device according to claim 9, further comprising a gate electrode over the second oxide semiconductor layer.

15. The semiconductor device according to claim 9, further comprising a gate electrode, wherein the first oxide semiconductor layer is over the gate electrode.

16. The semiconductor device according to claim 9, wherein the semiconductor device is a CPU or an MPU.

17. The semiconductor device according to claim 9, wherein at least one of the first circuit block and the second circuit block comprises a memory circuit.

\* \* \* \* \*